US012567564B2

(12) United States Patent      (10) Patent No.:    US 12,567,564 B2

Simpson et al.               (45) Date of Patent:      Mar. 3, 2026

(54) CORROSION-RESISTANT COMPONENTS

(71) Applicant: CoorsTek, Inc., Golden, CO (US)

(72) Inventors: Matthew Simpson, Evergreen, CO
(US); Ramesh Divakar, Arvada, CO
(US); Alan Filer, Longmont, CO (US)

(73) Assignee: CoorsTek, Inc., Golden, CO (US)

( * ) Notice: Subject to any disclaimer, the term of this
patent is extended or adjusted under 35
U.S.C. 154(b) by 979 days.

(21) Appl. No.: 17/382,735

(22) Filed: Jul. 22, 2021

(65)          Prior Publication Data

US 2022/0013335 A1     Jan. 13, 2022

Related U.S. Application Data

(63) Continuation of application No. 15/593,888, filed on
May 12, 2017, now Pat. No. 11,376,822, which is a
(Continued)

(51) Int. Cl.
| | |
|---|---|
| *B32B 18/00* | (2006.01) |
| *C04B 35/10* | (2006.01) |
| *C04B 35/581* | (2006.01) |
| *C04B 35/626* | (2006.01) |
| *C04B 35/645* | (2006.01) |
| *C23C 14/56* | (2006.01) |

(Continued)

(52) U.S. Cl.
CPC ........ *H01J 37/32477* (2013.01); *B32B 18/00*
(2013.01); *C04B 35/10* (2013.01); *C04B*
*35/581* (2013.01); *C04B 35/62655* (2013.01);
*C04B 35/62675* (2013.01); *C04B 35/645*
(2013.01); *C04B 35/6455* (2013.01); *C23C*
*14/564* (2013.01); *C23C 16/4404* (2013.01);
*C23C 16/45565* (2013.01); *C23C 16/46*
(2013.01); *H01J 37/3244* (2013.01); *H01J*
*37/32522* (2013.01); *H01J 37/32862*
(2013.01); *H01L 21/67069* (2013.01); *H01L*
*21/6719* (2013.01); *C04B 35/50* (2013.01);
*C04B 35/505* (2013.01); *C04B 2235/3217*
(2013.01); *C04B 2235/3224* (2013.01); *C04B*
*2235/3225* (2013.01); *C04B 2235/3229*
(2013.01); *C04B 2235/3244* (2013.01); *C04B*
*2235/3427* (2013.01); *C04B 2235/3847*
(2013.01); *C04B 2235/3865* (2013.01); *C04B*
*2235/3891* (2013.01); *C04B 2235/3895*
(2013.01); *C04B 2235/442* (2013.01); *C04B*
*2235/445* (2013.01); *C04B 2235/5445*
(2013.01); *C04B 2235/5454* (2013.01); *C04B*
*2235/604* (2013.01); *C04B 2235/6562*
(2013.01); *C04B 2235/6567* (2013.01); *C04B*
*2235/658* (2013.01); *C04B 2235/72* (2013.01);
*C04B 2235/721* (2013.01); *C04B 2235/77*
(2013.01); *C04B 2235/785* (2013.01); *C04B*
*2235/786* (2013.01); *C04B 2235/788*
(2013.01); *C04B 2235/80* (2013.01); *C04B*
*2235/96* (2013.01); *C04B 2235/9607*
(2013.01); *C04B 2235/9661* (2013.01); *C04B*
*2235/9669* (2013.01); *C04B 2235/9692*
(2013.01); *C04B 2237/062* (2013.01); *C04B*
*2237/064* (2013.01); *C04B 2237/122*
(2013.01); *C04B 2237/34* (2013.01); *C04B*
*2237/341* (2013.01); *C04B 2237/343*
(2013.01); *C04B 2237/36* (2013.01); *C04B*
*2237/366* (2013.01); *C04B 2237/368*
(2013.01); *C04B 2237/403* (2013.01); *C04B*
*2237/567* (2013.01); *C04B 2237/68* (2013.01);
*C04B 2237/704* (2013.01); *C04B 2237/708*
(2013.01); *H01J 37/32119* (2013.01); *H01J*
*2237/166* (2013.01); *H01J 2237/334*
(2013.01); *H01J 2237/3341* (2013.01)

(58) Field of Classification Search
None
See application file for complete search history.

(56)           References Cited

U.S. PATENT DOCUMENTS

| | | | |
|---|---|---|---|
| 5,004,712 | A | 4/1991 | Borglum |
| 6,326,087 | B1 | 12/2001 | Nishiuchi et al. |

(Continued)

FOREIGN PATENT DOCUMENTS

| | | |
|---|---|---|
| CN | 1663017 | 8/2005 |
| CN | 101042996 | 9/2007 |

(Continued)

OTHER PUBLICATIONS

Sainz, et al. "Silicon Nitride Joining Using Silica and Yttria
Ceramic Interlayers". J. Am. Ceram. Soc., 85. 941-46 (2002). (Year:
2002).*

(Continued)

*Primary Examiner* — Sheng H Davis
(74) *Attorney, Agent, or Firm* — Greenberg Traurig, LLP

(57)            ABSTRACT

A corrosion-resistant component configured for use with a
semiconductor processing reactor, the corrosion-resistant
component comprising: a) a ceramic insulating substrate;
and, b) a white corrosion-resistant non-porous outer layer
associated with the ceramic insulating substrate, the white
corrosion-resistant non-porous outer layer having a thick-
ness of at least 50 μm, a porosity of at most 1%, and a
composition comprising at least 15% by weight of a rare
earth compound based on total weight of the corrosion-
resistant non-porous layer; and, c) an L* value of at least 90
as measured on a planar surface of the white corrosion-
resistant non-porous outer layer. Methods of making are also
disclosed.

22 Claims, 7 Drawing Sheets

Related U.S. Application Data continuation-in-part of application No. 15/353,429, filed on Nov. 16, 2016, now abandoned.

(60) Provisional application No. 62/255,769, filed on Nov. 16, 2015.

(51) Int. Cl.

| | | |
|---|---|---|
| *C23C 16/44* | (2006.01) |
| *C23C 16/455* | (2006.01) |
| *C23C 16/46* | (2006.01) |
| *H01J 37/32* | (2006.01) |
| *H01L 21/67* | (2006.01) |
| *C04B 35/50* | (2006.01) |
| *C04B 35/505* | (2006.01) |

(56) References Cited

U.S. PATENT DOCUMENTS

| | | | |
|---|---|---|---|
| 6,783,875 | B2 | 8/2004 | Yamada et al. |
| 7,329,467 | B2 | 2/2008 | Billieres et al. |
| 7,462,407 | B2 | 12/2008 | Maeda et al. |
| 7,528,086 | B2 | 5/2009 | Villalobos et al. |
| 7,582,367 | B2 | 9/2009 | Aihara et al. |
| 7,972,196 | B2 | 7/2011 | Tanikella et al. |
| 7,983,017 | B2 | 7/2011 | Simpson |
| 8,367,227 | B2 | 2/2013 | Sun et al. |
| 8,516,857 | B2 | 8/2013 | Kwon et al. |
| 8,585,844 | B2 | 11/2013 | Shih et al. |
| 2002/0110709 | A1 | 8/2002 | Katsuda et al. |
| 2003/0232221 | A1 | 12/2003 | Yamada et al. |
| 2004/0110016 | A1* | 6/2004 | Hamaya ............ C23C 4/11 |
| | | | 428/472 |
| 2006/0043065 | A1* | 3/2006 | Buchberger, Jr. .......................... |
| | | | H01L 21/67109 |
| | | | 156/345.1 |
| 2006/0073349 | A1* | 4/2006 | Aihara ............ C04B 37/005 |
| | | | 264/642 |
| 2006/0178010 | A1 | 8/2006 | Iwasawa et al. |
| 2007/0280847 | A1 | 12/2007 | Nurnberger et al. |
| 2008/0169588 | A1 | 7/2008 | Shih et al. |
| 2008/0207432 | A1 | 8/2008 | Hamada |
| 2008/0314890 | A1 | 12/2008 | Willkens |
| 2009/0261065 | A1 | 10/2009 | Singh et al. |
| 2010/0248932 | A1 | 9/2010 | Menke et al. |
| 2011/0091700 | A1 | 4/2011 | Simpson |
| 2011/0129684 | A1 | 6/2011 | Okamoto et al. |
| 2013/0023401 | A1 | 1/2013 | Watanabe et al. |
| 2014/0265832 | A1 | 9/2014 | Kenney et al. |
| 2015/0024155 | A1 | 1/2015 | Sun et al. |
| 2015/0243541 | A1 | 8/2015 | Hayashi |
| 2015/0283791 | A1 | 10/2015 | Yamashita et al. |
| 2016/0333471 | A1 | 11/2016 | Lee et al. |
| 2017/0140902 | A1 | 5/2017 | Simpson et al. |
| 2017/0250057 | A1 | 8/2017 | Simpson et al. |

FOREIGN PATENT DOCUMENTS

| | | | |
|---|---|---|---|
| CN | 103074562 | | 5/2013 |
| CN | 103074563 | | 5/2013 |
| CN | 103681793 | | 3/2014 |
| EP | 1119026 | | 7/2001 |
| EP | 1158072 | | 11/2001 |
| EP | 1 245 696 | A2 | 3/2002 |
| GB | 2110871 | | 6/1983 |
| JP | 2001-274230 | | 10/2001 |
| JP | 2002-001865 | | 1/2002 |
| JP | 2003-297906 | | 10/2003 |
| JP | 2005-243987 | | 2/2004 |
| JP | 2004-100039 | | 4/2004 |
| JP | 2004-292270 | | 10/2004 |
| JP | 2005-170728 | | 6/2005 |
| JP | 2006-128603 | | 5/2006 |
| JP | 2008098626 | * | 4/2008 |
| JP | 2009-263187 | | 11/2009 |
| JP | 4688307 | | 5/2011 |
| JP | 2013-532770 | | 8/2013 |
| JP | 2015-163569 | | 9/2015 |
| KR | 20110020221 | * | 3/2011 |
| WO | WO 2005/009919 | | 2/2005 |
| WO | WO 2009/072318 | | 6/2009 |
| WO | 2012060341 | * | 5/2012 |
| WO | WO 2015/108277 | | 7/2015 |
| WO | WO 2017/087474 | | 5/2017 |

OTHER PUBLICATIONS

Decision to Grant with English Translation for Japan Patent Application No. 2018-525431, dated Nov. 2, 2021 5 pages.

Official Action with machine translation for Taiwan Patent Application No. 107116159, dated Sep. 23, 2021 15 pages.

"Feature analysis of independent claim 1 of the Contested Patent," Gille-Hrabal, Date Unknown, 1 page.

"Lab-Farbraum," (with English translation), Wikipedia.org, Jul. 6, 2016, 14 pages.

Harris, "Materials for Infrared Windows and Domes: Properties and Performance," SPIE Optical Engineering Press, 1999, pp. 154-157.

Kitamura et al., "Structural, Mechanical and Erosion Properties of Yttrium Oxide Coatings by Axial Suspension Plasma Spraying for Electronics Applications," Journal of Thermal Spray Technology, vol. 20, Nov. 12, 2010, pp. 170-185.

Zhang et al., "Fabrication of Transparent Yttria by High-Pressure Spark Plasma Sintering," Journal of the American Ceramic Society, vol. 94, No. 10, Oct. 2011, pp. 3206-3210.

Official Action (with English translation) for China Patent Application No. 2021052702055780, dated Jan. 20, 2022 16 pages.

Notice of Opposition to Europe Patent Application No. 17729576.3, dated Mar. 14, 2022, 47 pages.

Decision to Grant for Japan Patent Application No. 2019-547068, dated Mar. 15, 2022 3 pages.

Decision to Grant (with English Translation) for Korea Patent Application No. 10-2019-7017241, dated Jan. 17, 2022 20 pages.

Official Action for Taiwan Patent Application No. 107116159, dated Jan. 25, 2022 8 pages.

Official Action for U.S. Appl. No. 15/353,429, dated Feb. 14, 2022 20 pages.

Notice of Allowance for U.S. Appl. No. 15/593,888, dated Jan. 27, 2022, 9 pages.

Kramer et al., "Infiltration-Inhibiting Reaction of Gadolinium Zirconate Thermal Barrier Coatings with CMAS Melts," Journal of the American Ceramic Society, vol. 91, No. 2, 2008, pp. 576-583.

Milanov et al., "Rare-Earth based Oxide and Nitride Thin Films Employing Volatile Homoleptic Guanidinate Precursors," ECS Transactions, vol. 25, No. 8, 2009, pp. 143-150.

Topping et al., "CVD Lu203:Eu coatings for advanced scintillators," International Journal of Refractory Metals & Hard Materials, vol. 27, 2009, pp. 498-501.

Borchardt, "On the Oxidation of Yttrium," Journal of Inorganic Nuclear Chemistry, vol. 26, 1964, pp. 711-719.

Helferich et al., "An Investigation of Yttrium Oxide as a Crucible Material for Melting Titanium," Naval Ship Research and Development Center, National Technical Information Service, U.S. Department of Commerce, Jan. 1973, 29 pages.

International Search Report and Written Opinion issued in PCT/US2016/062210, mailed Feb. 9, 2017, 15 pages.

International Preliminary Report on Patentability for International (PCT) Patent Application No. PCT/US2016/062210, dated May 22, 2018, 9 pages.

Official Action (with English translation) for Chinese Patent Application No. 201680077987.4, dated Jul. 23, 2020, 10 pages.

Notice of Allowance (with English translation) for Chinese Patent Application No. 201680077987.4, dated Jan. 6, 2021, 3 pages.

Article 94(3) Communication for European Patent Application No. 16810521.1, dated Feb. 16, 2021, 6 pages.

Official Action (with English translation) for Japanese Patent Application No. 2018-525431, dated Oct. 20, 2020, 16 pages.

(56)     References Cited

OTHER PUBLICATIONS

Official Action with English Translation for Japan Patent Application No. 2018-525431, dated Jun. 8, 2021 12 pages.
International Search Report and Written Opinion issued in PCT/US2017/032468, mailed Nov. 21, 2017, 19 pages.
Invitation to Pay Additional Fees and Partial Search Report issued in PCT/US2017/032468, mailed Jul. 21, 2017, 15 pages.
International Preliminary Report on Patentability for International (PCT) Patent Application No. PCT/US2017/032468, dated May 21, 2019, 12 pages.
English Translation of Official Action for China Patent Application No. 2021052702055780, dated Jun. 1, 2021 16 pages.
Intent to Grant European Patent Application No. 17729576.3, dated Aug. 31, 2020, 7 pages.
Intent to Grant European Patent Application No. 17729576.3, dated Feb. 2, 2021, 7 pages.
Extended European Search Report for European Patent Application No. 19178123.6, dated Sep. 20, 2019, 7 pages.
Article 94(3) Communication for European Patent Application No. 19178123.6, dated Oct. 12, 2020, 4 pages.
Official Action (with English translation) for Japanese Patent Application No. 2019-547068, dated Feb. 16, 2021, 9 pages.
Official Action with machine translation for Japan Patent Application No. 2019-547068, dated Sep. 14, 2021 9 pages.

Official Action with English Translation for Korea Patent Application No. 10-2019-7017241, dated Aug. 17, 2021 20 pages.
Official Action for U.S. Appl. No. 15/353,429, dated Jun. 21, 2019, 11 pages. Restriction Requirement.
Official Action for U.S. Appl. No. 15/353,429, dated Sep. 9, 2019, 8 pages.
Official Action for U.S. Appl. No. 15/353,429, dated Jan. 28, 2020, 19 pages.
Official Action for U.S. Appl. No. 15/353,429, dated Aug. 18, 2020, 12 pages.
Official Action for U.S. Appl. No. 15/353,429, dated Feb. 25, 2021, 13 pages.
Official Action for U.S. Appl. No. 15/353,429, dated Aug. 25, 2021 18 pages.
Official Action for U.S. Appl. No. 15/593,888, dated Jun. 24, 2019, 9 pages. Restriction Requirement.
Official Action for U.S. Appl. No. 15/593,888, dated Oct. 7, 2019, 19 pages.
Official Action for U.S. Appl. No. 15/593,888, dated Mar. 23, 2020, 24 pages.
Official Action for U.S. Appl. No. 15/593,888, dated Nov. 3, 2020, 25 pages.
Official Action for U.S. Appl. No. 15/593,888, dated Mar. 3, 2021, 23 pages.

* cited by examiner

100

300

320

330

360

310

340

380

CORROSION-RESISTANT COMPONENTS

CROSS-REFERENCE TO RELATED APPLICATIONS

This application is a continuation of U.S. patent application Ser. No. 15/593,888 filed May 12, 2017, which is a continuation-in-part patent application and claims priority to U.S. patent application Ser. No. 15/353,429 filed Nov. 16, 2016, which claims priority to U.S. Provisional Patent Application Ser. No. 62/255,769 filed Nov. 16, 2015, each of which are incorporated herein by reference in their entirety for all purposes.

FIELD

The present disclosure relates generally to corrosion-resistant components for the processing of equipment, such as semiconductors, and to methods of making such corrosion-resistant components.

BACKGROUND

The processing of semiconductors frequently involves corrosive gases such as halogens in association with strong electric and magnetic fields. This combination of a corrosive environment and strong electric/magnetic fields generates a need for corrosion-resistant insulators. It is generally accepted that the most corrosion-resistant insulating materials for such applications are rare earth compounds, such as yttrium oxide (also known as "yttria"). Unfortunately, rare earth compounds tend to be both expensive and mechanically weak. The industry therefore tends to use coatings of rare earth compounds on less expensive insulators like aluminum oxide.

Several different coating methods have been used for the insulators. Physical vapor deposition (PVD) coatings have been used. These have the drawback that they are costly to apply for thicknesses of more than 10 μm. Thick, dense layers tend to spall due to internal stresses in the as-deposited coatings. Strain-tolerant thick PVD coatings made are known to contain fissures between crystallites that create the potential for shedding particles. Chemical vapor deposition (CVD) for coating application has been used, but it suffers the similar drawbacks. High rate deposition tends to produce fissures between grains. Denser coatings made by CVD are characterized by a grain size that tends to be small, typically less than 100 nm. Aerosol deposition has been used and it also suffers from cost limitations and an inability to make thick coatings that do not spall. Thermal plasma spray is the most widely used coating technology in the semiconductor equipment industry, but it cannot produce rare-earth coatings with porosity less than 1%, and therefore is prone to the shedding of particles. Furthermore, plasma spray coatings commonly contain a high density of microcracks (typically more than 100/mm²), and this, together with the porosity, leads to the shedding of particles.

Ceramic lids are commonly interposed between induction coils and induction plasma used for etching in the semiconductor industry. Insulating rings surrounding the wafer chuck and other chamber parts in etch and deposition equipment need to be corrosion-resistant as well as stable, for the reasons outlined above.

Another need in the semiconductor equipment industry is for high temperature corrosion-resistant wafer heaters.

These needs are addressed by the corrosion-resistant components and assemblies of the invention.

BRIEF SUMMARY

These and other needs are addressed by the various aspects, embodiments, and configurations of the present disclosure.

Embodiments of the present disclosure include a corrosion-resistant component configured for use with a semiconductor processing reactor, the corrosion-resistant component comprising: a) a ceramic insulating substrate; and, b) a corrosion-resistant non-porous layer associated with the ceramic insulating substrate, the corrosion-resistant non-porous layer having a composition comprising at least 15% by weight of a rare earth compound based on total weight of the corrosion-resistant non-porous layer; and, the corrosion-resistant non-porous layer characterized by a microstructure substantially devoid of microcracks and fissures, and having an average grain size of at least about 100 nm and at most about 100 μm.

The corrosion-resistant component according to the preceding paragraph, wherein the ceramic insulating substrate is selected from the group consisting of aluminum oxide, aluminum nitride, silicon nitride, silicate-based materials and mixtures of two or more thereof.

The corrosion-resistant component according to either of the two preceding paragraphs, wherein the rare earth compound is selected from the group consisting of yttrium oxide (Y2O3), yttrium silicates, yttrium fluorides, yttrium oxyfluorides, yttrium aluminates, nitrides, complex nitride compounds, and combinations of two or more thereof.

The corrosion-resistant component according to any of the three preceding paragraphs, wherein the corrosion-resistant non-porous layer is adhered to the ceramic insulating substrate, and the corrosion-resistant non-porous layer has: a porosity of at most 1%; an adhesion strength of at least 20 MPa; and, a thickness of at least 50 μm.

The corrosion-resistant component according to any of the four preceding paragraphs, wherein the corrosion-resistant non-porous layer has: a porosity of at most 0.5%; an adhesion strength of at least 30 MPa; a thickness of at least 100 μm; and, an average grain size of at least about 300 μm and at most about 30 μm.

The corrosion-resistant component according to any of the five preceding paragraphs, wherein the ceramic insulating substrate is aluminum oxide and the rare earth compound is a trivalent rare earth oxide.

The corrosion-resistant component according to any of the six preceding paragraphs, wherein the ceramic insulating substrate is aluminum nitride and the corrosion-resistant non-porous layer is a rare earth silicate.

The corrosion-resistant component according to any of the seven preceding paragraphs, wherein the corrosion-resistant component is a lid configured for releasable engagement with a plasma etch reactor and has a loss tangent of less than $1 \times 10^{-4}$.

The corrosion-resistant component according to any of the eight preceding paragraphs, further comprising at least one interposing layer embedded in the ceramic insulating substrate, or layered between the ceramic insulating substrate and the corrosion-resistant non-porous layer.

The corrosion-resistant component according to any of the nine preceding paragraphs, wherein the at least one interposing layer is at least one material chosen from rare earth oxides, rare earth silicates, rare earth aluminates, and mixtures of two or more thereof, the at least one interposing layer further comprising a sintering aid added to the at least one material chosen from rare earth oxides, rare earth silicates, rare earth aluminates, and mixtures of two or more thereof The corrosion-resistant component according to any of the ten preceding paragraphs, wherein the at least one interposing layer is ytterbium oxide (Yb2O3) and a sintering aid is added to the ytterbium oxide in the range from about 300 ppm to about 20% by weight based upon total weight of the ytterbium oxide.

The corrosion-resistant component according to any of the eleven preceding paragraphs, wherein the at least one interposing layer comprises conducting materials.

The corrosion-resistant component according to any of the twelve preceding paragraphs, wherein the at least one interposing layer further comprises insulating materials.

The corrosion-resistant component according to any of the thirteen preceding paragraphs, wherein the at least one interposing layer is adhered to both the corrosion-resistant non-porous layer and to the ceramic insulating substrate, and the corrosion-resistant non-porous layer has: a porosity of at most 1%; an adhesion strength of at least 201 VIPa; and, a thickness of at least 50 µm.

Embodiments of the present disclosure also include a green laminate configured for use with a semiconductor processing reactor, the green laminate comprising: a first layer of green sinterable material selected from the group consisting of aluminum oxide, aluminum nitride, silicon nitride, silicate-based materials, and mixtures of two or more thereof; a second layer of green sinterable material selected from the group consisting of yttrium oxide (Y$_2$O$_3$), yttrium silicates, yttrium fluorides, yttrium oxyfluorides, yttrium aluminates, nitrides, complex nitride compounds, and combinations of two or more thereof, and, wherein upon heat treatment of the green laminate, the second layer has a porosity of at most 1% and an average grain size of at least about 100 µm and at most about 100 µm.

The green laminate according to the preceding paragraph, wherein upon heat treatment of the green laminate, the second layer has a porosity of at most 0.5% and an average grain size of at least about 300 µm and at most about 30 µm.

The green laminate according to either of the two preceding paragraphs, further comprising at least one interposing layer between the first and second layers, wherein the at least one interposing layer comprises green sinterable material selected from the group consisting of rare earth oxides, rare earth silicates, rare earth aluminates, and mixtures of two or more thereof.

The green laminate according to any of the three preceding paragraphs, wherein the heat treatment is selected from the group consisting of hot pressing and hot isostatic pressing.

Embodiments of the present disclosure also include an assembly configured for use in fabricating semiconductor chips, the assembly comprising: a reactor; and, a corrosion-resistant component including: a ceramic insulating substrate; and, a corrosion-resistant non-porous layer associated with the ceramic insulating substrate, the corrosion-resistant non-porous layer of a composition comprising at least 15% by weight of a rare earth compound based on total weight of the corrosion-resistant non-porous layer and is characterized by a microstructure substantially devoid of microcracks and fissures, and having: a thickness of at least 50 µm; a porosity of at most 1%; and, an average grain size of at least 100 µm and at most 100 µm.

The assembly according to the preceding paragraph, wherein the ceramic insulating substrate is selected from the group consisting of aluminum oxide, aluminum nitride, silicon nitride, silicate-based materials and mixtures of two or more thereof.

The assembly according to either of the two preceding paragraphs, wherein the rare earth compound is selected from the group consisting of yttrium oxide (Y$_2$O$_3$), yttrium silicates, yttrium fluorides, yttrium oxyfluorides, yttrium aluminates, nitrides, complex nitride compounds, and combinations of two or more thereof.

The assembly according to any of the three preceding paragraphs, wherein the corrosion-resistant non-porous layer is adhered to the ceramic insulating substrate and has an adhesion strength of at least 20 MPa.

The assembly according to any of the four preceding paragraphs, wherein the corrosion-resistant non-porous layer has: a thickness of at least 100 µm; a porosity of at most 0.5%; an adhesion strength of at least 301 VIPa; and, an average grain size of at least about 300 µm and at most about 30 µm.

The assembly according to any of the five preceding paragraphs, further comprising at least one interposing layer embedded in the ceramic insulating substrate, or layered between the ceramic insulating substrate and the corrosion-resistant non-porous layer.

The assembly according to any of the six preceding paragraphs, wherein the at least one interposing layer is at least one material chosen from rare earth oxides, rare earth silicates, rare earth aluminates, and mixtures of two or more thereof, the at least one interposing layer further comprising a sintering aid added to the at least one material chosen from rare earth oxides, rare earth silicates, rare earth aluminates, and mixtures of two or more thereof The assembly according to any of the seven preceding paragraphs, wherein the at least one interposing layer is ytterbium oxide (Yb$_2$O$_3$) and a sintering aid is added to the ytterbium oxide in the range from about 300 ppm to about 20% by weight based upon total weight of the ytterbium oxide.

The assembly according to any of the eight preceding paragraphs, wherein the at least one interposing layer comprises conducting materials.

The assembly according to any of the nine paragraphs, wherein the at least one interposing layer further comprises insulating materials.

The assembly according to any of the ten preceding paragraphs, wherein the at least one interposing layer is selected from the group consisting of ytterbium oxide (Yb$_2$O$_3$), molybdenum (Mo), tungsten ov), molybdenum disilicide (MoSi$_2$), tungsten carbide (WC), tungsten disilicide (WSi$_2$), and mixtures of two or more thereof The assembly according to any of the eleven preceding paragraphs, wherein the reactor is a plasma etch reactor configured for plasma etching and the corrosion-resistant component is a lid configured for releasable engagement with the plasma etch reactor; and, wherein the lid has a loss tangent of less than $1 \times 10^{-4}$.

The assembly according to any of the twelve preceding paragraphs, wherein the reactor is a deposition reactor configured for in-situ cleaning with halogen gases and the corrosion-resistant component is a heater.

The assembly according to any of the thirteen preceding paragraphs, wherein the reactor is a deposition reactor configured for in-situ cleaning with halogen gases and the corrosion-resistant component is a showerhead.

The assembly according to any of the fourteen preceding paragraphs, wherein the substrate further includes at least one interposing conductive layer embedded therein, the conductive layer having a sheet resistivity of at most 10 Megaohm-cm and a coefficient thermal expansion difference of at most $4\times10^{-6}$/K relative to the coefficients of thermal expansion for the ceramic insulating substrate and the corrosion-resistant non-porous layer.

Embodiments of the present disclosure also include a corrosion-resistant component configured for use with a semiconductor processing reactor, the corrosion-resistant component comprising: a) a ceramic insulating substrate; and, b) a corrosion-resistant non-porous layer associated with the ceramic insulating substrate, the corrosion-resistant non-porous layer having a composition comprising at least 15% by weight of a rare earth compound based on total weight of the corrosion-resistant non-porous layer; and, the corrosion-resistant non-porous layer characterized by a microstructure devoid of microcracks and fissures, and having an average grain size of at least 100 μm and at most 100 μm.

The corrosion-resistant component according to the preceding paragraph, wherein the ceramic insulating substrate is selected from the group consisting of aluminum oxide, aluminum nitride, silicon nitride, silicate-based materials and mixtures of two or more thereof.

The corrosion-resistant component according to either of the two preceding paragraphs, wherein the rare earth compound is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof.

The corrosion-resistant component according to any of the three preceding paragraphs, wherein the corrosion-resistant non-porous layer is adhered to the ceramic insulating substrate, and the corrosion-resistant non-porous layer has: a porosity of at most 1%; an adhesion strength of at least 20 MPa; and, a thickness of at least 50 μm.

The corrosion-resistant component according to any of the four preceding paragraphs, wherein the corrosion-resistant non-porous layer has: a porosity of at most 0.5%; an adhesion strength of at least 30 MPa; a thickness of at least 100 μm; and, an average grain size of at least 300 μm and at most 30 μm.

The corrosion-resistant component according to any of the five preceding paragraphs, wherein the ceramic insulating substrate is aluminum oxide and the rare earth compound is a trivalent rare earth oxide.

The corrosion-resistant component according to any of the six preceding paragraphs, wherein the ceramic insulating substrate is aluminum nitride and the corrosion-resistant non-porous layer is a rare earth silicate.

The corrosion-resistant component according to any of the seven preceding paragraphs, wherein the corrosion-resistant component is a lid configured for releasable engagement with a plasma etch reactor and has a loss tangent of less than $1\times10^{-4}$.

The corrosion-resistant component according to any of the eight preceding paragraphs, further comprising at least one interposing layer embedded in the ceramic insulating substrate, or layered between the ceramic insulating substrate and the corrosion-resistant non-porous layer.

The corrosion-resistant component according to any of the nine preceding paragraphs, wherein the at least one interposing layer is at least one material chosen from rare earth oxides, rare earth silicates, rare earth aluminates, and mixtures of two or more thereof, the at least one interposing layer further comprising a sintering aid added to the at least one material chosen from rare earth oxides, rare earth silicates, rare earth aluminates, and mixtures of two or more thereof.

The corrosion-resistant component according to any of the ten preceding paragraphs, wherein the at least one interposing layer is ytterbium oxide ($Yb_2O_3$) and a sintering aid is added to the ytterbium oxide in the range from about 300 ppm to about 20% by weight based upon total weight of the ytterbium oxide.

The corrosion-resistant component according to any of the eleven preceding paragraphs, wherein the at least one interposing layer comprises conducting materials.

The corrosion-resistant component according to any of the twelve preceding paragraphs, wherein the at least one interposing layer further comprises insulating materials.

The corrosion-resistant component according to any of the thirteen preceding paragraphs, wherein the at least one interposing layer is adhered to both the corrosion-resistant non-porous layer and to the ceramic insulating substrate, and the corrosion-resistant non-porous layer has: a porosity of at most 1%; an adhesion strength of at least 20 MPa; and, a thickness of at least 50 μm.

Embodiments of the present disclosure also include a green laminate configured for use with a semiconductor processing reactor, the green laminate comprising: a first layer of green sinterable material selected from the group consisting of aluminum oxide, aluminum nitride, silicon nitride, silicate-based materials, and mixtures of two or more thereof; a second layer of green sinterable material selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof, and, wherein upon heat treatment of the green laminate, the second layer has a porosity of at most 1% and an average grain size of at least 100 μm and at most 100 μm.

The green laminate according to the preceding paragraph, wherein upon heat treatment of the green laminate, the second layer has a porosity of at most 0.5% and an average grain size of at least 300 μm and at most 30 μm.

The green laminate according to either of the two preceding paragraphs, further comprising at least one interposing layer between the first and second layers, wherein the at least one interposing layer comprises green sinterable material selected from the group consisting of rare earth oxides, rare earth silicates, rare earth aluminates, and mixtures of two or more thereof.

The green laminate according to any of the three preceding paragraphs, wherein the heat treatment is selected from the group consisting of hot pressing and hot isostatic pressing.

Embodiments of the present disclosure also include an assembly configured for use in fabricating semiconductor chips, the assembly comprising: a reactor; and, a corrosion-resistant component including: a ceramic insulating substrate; and, a corrosion-resistant non-porous layer associated with the ceramic insulating substrate, the corrosion-resistant non-porous layer of a composition comprising at least 15% by weight of a rare earth compound based on total weight of the corrosion-resistant non-porous layer and is characterized by a microstructure devoid of microcracks and fissures, and having: a thickness of at least 50 μm; a porosity of at most 1%; and, an average grain size of at least 100 μm and at most 100 μm.

The assembly according to the preceding paragraph, wherein the ceramic insulating substrate is selected from the group consisting of aluminum oxide, aluminum nitride, silicon nitride, silicate-based materials and mixtures of two or more thereof.

The assembly according to either of the two preceding paragraphs, wherein the rare earth compound is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof.

The assembly according to any of the three preceding paragraphs, wherein the corrosion-resistant non-porous layer is adhered to the ceramic insulating substrate and has an adhesion strength of at least 20 MPa.

The assembly according to any of the four preceding paragraphs, wherein the corrosion-resistant non-porous layer has: a thickness of at least 100 μm; a porosity of at most 0.5%; an adhesion strength of at least 30 MPa; and, an average grain size of at least 300 μm and at most 30 μm.

The assembly according to any of the five preceding paragraphs, further comprising at least one interposing layer embedded in the ceramic insulating substrate, or layered between the ceramic insulating substrate and the corrosion-resistant non-porous layer.

The assembly according to any of the six preceding paragraphs, wherein the at least one interposing layer is at least one material chosen from rare earth oxides, rare earth silicates, rare earth aluminates, and mixtures of two or more thereof, the at least one interposing layer further comprising a sintering aid added to the at least one material chosen from rare earth oxides, rare earth silicates, rare earth aluminates, and mixtures of two or more thereof The assembly according to any of the seven preceding paragraphs, wherein the at least one interposing layer is ytterbium oxide ($Yb_2O_3$) and a sintering aid is added to the ytterbium oxide in the range from about 300 ppm to about 20% by weight based upon total weight of the ytterbium oxide.

The assembly according to any of the eight preceding paragraphs, wherein the at least one interposing layer comprises conducting materials.

The assembly according to any of the nine preceding paragraphs, wherein the at least one interposing layer further comprises insulating materials.

The assembly according to any of the ten preceding paragraphs, wherein the at least one interposing layer is selected from the group consisting of ytterbium oxide ($Yb_2O_3$), molybdenum (Mo), tungsten ov), molybdenum disilicide ($MoSi_2$), tungsten carbide (WC), tungsten disilicide ($WSi_2$), and mixtures of two or more thereof.

The assembly according to any of the eleven preceding paragraphs, wherein the reactor is a plasma etch reactor configured for plasma etching and the corrosion-resistant component is a lid configured for releasable engagement with the plasma etch reactor; and, wherein the lid has a loss tangent of less than $1 \times 10^{-4}$.

The assembly according to any of the twelve preceding paragraphs, wherein the reactor is a deposition reactor configured for in-situ cleaning with halogen gases and the corrosion-resistant component is a heater.

The assembly according to any of the thirteen preceding paragraphs, wherein the reactor is a deposition reactor configured for in-situ cleaning with halogen gases and the corrosion-resistant component is a showerhead.

The assembly according to any of the fourteen preceding paragraphs, wherein the substrate further includes at least one interposing conductive layer embedded therein, the conductive layer having a sheet resistivity of at most 10

Megaohm-cm and a coefficient thermal expansion difference of at most $4 \times 10^{-6}$/K relative to the coefficients of thermal expansion for the ceramic insulating substrate and the corrosion-resistant non-porous layer.

Embodiments of the present disclosure include a method for preparing a corrosion-resistant component for use with a semiconductor processing reactor, comprising: laying up a thinner layer of a sinterable powder composition comprising at least 15% by weight based on total weight of the thinner layer of a rare earth compound, and a thicker layer of sinterable substrate material to form a pre-laminate; and, heat treating the pre-laminate to form a corrosion-resistant component including a corrosion-resistant non-porous outermost layer characterized by a microstructure devoid of microcracks and fissures, and having an average grain size of at least 100 μm and at most 100 pm.

The method according to the preceding paragraph, wherein heat treating is selected from the group consisting of hot pressing and hot isostatic pressing.

The method according to either of the two preceding paragraphs, wherein the sinterable substrate material is selected from the group consisting of aluminum oxide, aluminum nitride, silicate-based materials, and mixtures of two or more thereof The method according to any of the three preceding paragraphs, wherein the rare earth compound is selected from the group consisting of yttrium oxide ($Y_2O_3$), yttrium silicates, yttrium fluorides, yttrium oxyfluorides, yttrium aluminates, nitrides, complex nitride compounds and combinations of two or more thereof.

The method according to any of the four preceding paragraphs, wherein the sinterable substrate material is aluminum oxide and the rare earth compound is a trivalent rare earth oxide.

The method according to any of the five preceding paragraphs, wherein the sinterable substrate material is aluminum nitride and the rare earth compound is a rare earth silicate.

The method according to any of the six preceding paragraphs, wherein the corrosion-resistant component is a lid configured for releasable engagement with a plasma etch reactor.

The method according to any of the seven preceding paragraphs, wherein the lid has a has a loss tangent of less than $1 \times 10^{-3}$.

The method according to any of the eight preceding paragraphs, wherein the lid has a has a loss tangent of less than $1 \times 10^{-4}$.

The method according to any of the nine preceding paragraphs, further comprising laying up at least one additional sinterable powder composition layer interposed between the rare earth compound thinner layer and the substrate material thicker layer, prior to heat treating.

The method according to any of the ten preceding paragraphs, wherein the at least one additional sinterable powder composition comprises a compound or metal having a coefficient thermal expansion difference of at most $4 \times 10^{-6}$/K relative to the coefficients of thermal expansion for the ceramic insulating substrate and the corrosion-resistant non-porous outermost layer.

The method according to any of the eleven preceding paragraphs, wherein the at least one additional sinterable powder composition comprises a compound, intermetallic compound, or metal selected from the group consisting of ytterbium oxide ($Yb_2O_3$), molybdenum (Mo), tungsten (W), niobium (Nb), molybdenum disilicide ($MoSi_2$), tungsten carbide (WC), tungsten disilicide ($WSi_2$), titanium carbide (TiC), titanium nitride (TiN), and mixtures of two or more thereof.

The method according to any of the twelve preceding paragraphs, wherein the at least one additional sinterable powder composition further comprises an insulating material selected from the group consisting of alumina, aluminum nitride, aluminates, silicates and mixtures of two or more thereof.

The method according to any of the thirteen preceding paragraphs, wherein the at least one additional sinterable powder composition is ytterbium oxide ($Yb_2O_3$).

The method according to any of the fourteen preceding paragraphs, wherein the at least one additional sinterable powder composition comprises conducting materials.

The method according to any of the fifteen preceding paragraphs, wherein the at least one additional sinterable powder composition further comprises insulating materials.

The method according to any of the sixteen preceding paragraphs, wherein the semiconductor processing reactor is a deposition reactor configured for in-situ cleaning with halogen gases and the corrosion-resistant component is a heater.

The method according to any of the seventeen preceding paragraphs, wherein the semiconductor processing reactor is a deposition reactor configured for in-situ cleaning with halogen gases and the corrosion-resistant component is a showerhead.

The method according to any of the eighteen preceding paragraphs, wherein the sinterable substrate material further includes at least one interposing conductive layer embedded therein, the conductive layer having a sheet resistivity of at most 10 Megaohm-cm and a coefficient thermal expansion difference of at most $4 \times 10^{-6}$/K relative to the coefficients of thermal expansion for the ceramic insulating substrate and the corrosion-resistant non-porous outermost layer.

Embodiments of the present disclosure include a corrosion-resistant component configured for use with a semiconductor processing reactor, the corrosion-resistant component comprising: a) a ceramic insulating substrate; and, b) a white corrosion-resistant non-porous outer layer associated with the ceramic insulating substrate, the white corrosion-resistant non-porous outer layer having a thickness of at least 50 μm, a porosity of at most 1%, and a composition comprising at least 15% by weight of a rare earth compound based on total weight of the corrosion-resistant non-porous layer; and, c) an L* value of at least 90 as measured on a planar surface of the white corrosion-resistant non-porous outer layer.

The corrosion-resistant component according to the preceding paragraph, further comprising an L* value of at least 92 as measured on a planar surface of the white corrosion-resistant non-porous outer layer.

The corrosion-resistant component according to either of the two preceding paragraphs, further comprising an L* value of at least 94 as measured on a planar surface of the white corrosion-resistant non-porous outer layer.

The corrosion-resistant component according to any of the three preceding paragraphs, wherein the ceramic insulating substrate is selected from the group consisting of aluminum oxide, aluminum nitride, silicon nitride, silicate-based materials and mixtures of two or more thereof.

The corrosion-resistant component according to any of the four preceding paragraphs, wherein the rare earth compound is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof.

The corrosion-resistant component according to any of the five preceding paragraphs, wherein the rare earth compound is yttrium oxide ($Y_2O_3$).

The corrosion-resistant component according to any of the six preceding paragraphs, wherein the white corrosion-resistant non-porous outer layer has a thickness of at least 100 μm, a porosity of at most 0.5%, and an average grain size of at most 50 μm.

The corrosion-resistant component according to any of the seven preceding paragraphs, wherein the white corrosion-resistant non-porous outer layer further comprises a sintering aid added to the rare-earth compound in the range from about 300 ppm to about 20% by weight based upon total weight of the rare-earth compound.

The corrosion-resistant component according to any of the eight preceding paragraphs, wherein the sintering aid added to the rare-earth compound is in the range from about 0.5% by weight to about 5% by weight based upon total weight of the rare-earth compound.

The corrosion-resistant component according to any of the nine preceding paragraphs, wherein the sintering aid is at least one material chosen from $ZrO_2$, $HfO_2$, and $CeO_2$.

The corrosion-resistant component according to any of the ten preceding paragraphs, wherein the sintering aid is $ZrO_2$ and is added to the rare-earth compound in the amount of 1% by weight based upon total weight of the rare-earth compound.

The corrosion-resistant component according to any of the eleven preceding paragraphs, further comprising at least one interposing layer embedded in the ceramic insulating substrate, or layered between the ceramic insulating substrate and the white corrosion-resistant non-porous outer layer, wherein the at least one interposing layer is at least one material chosen from rare earth oxides, rare earth silicates, rare earth aluminates, and mixtures of two or more thereof.

The corrosion-resistant component according to any of the twelve preceding paragraphs, wherein the at least one interposing layer is ytterbium oxide ($Yb_2O_3$).

The corrosion-resistant component according to any of the thirteen preceding paragraphs, wherein the at least one interposing layer further comprises a sintering aid added to the ytterbium oxide in the range from about 300 ppm to about 20% by weight based upon total weight of the ytterbium oxide.

The corrosion-resistant component according to any of the fourteen preceding paragraphs, wherein the at least one interposing layer further comprises conducting materials.

An assembly configured for use in fabricating semiconductor chips, the assembly comprising: a reactor; and, the corrosion-resistant component according to any of the fifteen preceding paragraphs.

The assembly according to the preceding paragraph, wherein the reactor is a plasma etch reactor configured for plasma etching and the corrosion-resistant component is a lid configured for releasable engagement with the plasma etch reactor; and, wherein the lid has a loss tangent of less than $1 \times 10^{-4}$.

The assembly according to either of the two preceding paragraphs, wherein the reactor is a deposition reactor configured for in-situ cleaning with halogen gases and the corrosion-resistant component is a heater.

Embodiments of the present disclosure include a method for preparing a white corrosion-resistant component for use with a semiconductor processing reactor, comprising: laying up a first layer of a sinterable powder composition comprising at least 15% by weight based on total weight of the first layer of a rare earth compound, and a second layer of sinterable substrate material to form a pre-laminate, wherein the sinterable substrate material is selected from the group consisting of aluminum oxide, aluminum nitride, silicon nitride, silicate-based materials and mixtures of two or more thereof: and wherein the first layer is less than 50% as thick as the second layer; and, heat treating the pre-laminate to form a corrosion-resistant component including a whiten corrosion-resistant non-porous outer layer, having a thickness of at least 50 μm and a porosity of at most 1%, to form a corrosion-resistant laminate; and, heat treating the corrosion-resistant laminate further in air at a temperature from at least 800 C to at most 1500 C for a time from at least 0.5 h to at most 48 h to form a white corrosion-resistant component having an L* value of at least 90 as measured on a planar surface of the white corrosion-resistant non-porous outer layer.

The method according to the preceding paragraph, wherein the white corrosion-resistant component has an L* value of at least 92 as measured on a planar surface of the corrosion-resistant non-porous outer layer.

The method according to either the two preceding paragraphs, wherein the white corrosion-resistant component has an L* value of at least 94 as measured on a planar surface of the corrosion-resistant non-porous outer layer.

The method according to any of the three preceding paragraphs, wherein the rare earth compound is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof.

The method according to any of the four preceding paragraphs, wherein the step of laying up a first layer of sinterable powder composition comprising at least 15% by weight based on total weight of the first layer of a rare earth compound further comprises a sintering aid added to the rare-earth compound in the range from about 300 ppm to about 20% by weight based upon total weight of the rare-earth compound.

The method according to any of the five preceding paragraphs, wherein the sintering aid is at least one material chosen from $ZrO_2$, $HfO_2$, and $CeO_2$.

The method according to any of the six preceding paragraphs, wherein the sintering aid added is in the amount of at least 0.5% by weight and at most 5% by weight based upon total weight of the rare-earth compound.

The method according to any of the seven preceding paragraphs, wherein the sintering aid added is $ZrO_2$ in the amount of about 1% by weight based upon total weight of the rare-earth compound.

The method according to any of the eight preceding paragraphs, wherein the step of laying up further comprises laying up at least one interposing layer of sinterable powder layered between the first layer and the second layer, wherein the at least one interposing layer of sinterable powder is at least one material chosen from rare earth oxides, rare earth silicates, rare earth aluminates, and mixtures of two or more thereof The method according to any of the nine preceding paragraphs, wherein the at least one interposing layer of sinterable powder is ytterbium oxide and further comprises a sintering aid added to the ytterbium oxide in the range from about 300 ppm to about 20% by weight based upon total weight of the ytterbium oxide.

Embodiments of the present disclosure include a corrosion-resistant component configured for use with a semiconductor processing reactor, the corrosion-resistant component comprising: a) a ceramic insulating substrate; and, b) a white corrosion-resistant non-porous outer layer associated with the ceramic insulating substrate, the white corrosion-resistant non-porous outer layer having a thickness of at least 50 μm, a porosity of at most 1%, and a composition comprising at least 15% by weight of a rare earth compound based on total weight of the corrosion-resistant non-porous layer and a sintering aid added to the rare-earth compound in the range from about 300 ppm to about 20% by weight based upon total weight of the rare-earth compound, wherein the sintering aid is at least one material chosen from $ZrO_2$, $HfO_2$, and $CeO_2$; c) at least one interposing layer embedded in the ceramic insulating substrate, or layered between the ceramic insulating substrate and the corrosion-resistant non-porous layer, wherein the at least one interposing layer is at least one material chosen from rare earth oxides, rare earth silicates, rare earth aluminates, and mixtures of two or more thereof, and, d) an L* value of at least 90 as measured on a planar surface of the white corrosion-resistant non-porous outer layer.

The corrosion-resistant component according to the preceding paragraph, wherein the at least one interposing layer is ytterbium oxide ($Yb_2O_3$) and further comprises a sintering aid added to the ytterbium oxide in the range from about 300 ppm to about 20% by weight based upon total weight of the ytterbium oxide.

Embodiments of the present disclosure include a corrosion-resistant component configured for use with a semiconductor processing reactor, the corrosion-resistant component comprising: a) a ceramic insulating substrate; b) a corrosion-resistant non-porous outer layer associated with the ceramic insulating substrate, the corrosion-resistant non-porous layer having a thickness of at least 50 μm, a porosity of at most 1%, and a composition comprising at least 15% by weight of a rare earth compound based on total weight of the corrosion-resistant non-porous layer and a first sintering aid added to the rare-earth compound in the range from about 300 ppm to about 20% by weight based upon total weight of the rare-earth compound; c) at least one interposing layer embedded in the ceramic insulating substrate, or layered between the ceramic insulating substrate and the corrosion-resistant non-porous layer, wherein the at least one interposing layer is at least one material chosen from rare earth oxides, rare earth silicates, rare earth aluminates, and mixtures of two or more thereof: the at least one interposing layer further comprising a second sintering aid added to the at least one material chosen from rare earth oxides, rare earth silicates, rare earth aluminates, and mixtures of two or more thereof: and, d) a carbon content of at most 1000 ppm.

The corrosion-resistant component according to the preceding paragraph, wherein the at least one interposing layer is ytterbium oxide and the second sintering aid is added to the ytterbium oxide in the range from about 300 ppm to about 20% by weight based upon total weight of the ytterbium oxide.

The corrosion-resistant component according to either of the two preceding paragraphs, wherein the first sintering aid is at least one material chosen from $ZrO_2$, $HfO_2$, and $CeO_2$ and the second sintering is at least one material chosen from $ZrO_2$, $HfO_2$, and $CeO_2$.

DETAILED DESCRIPTION

Figure 1A:
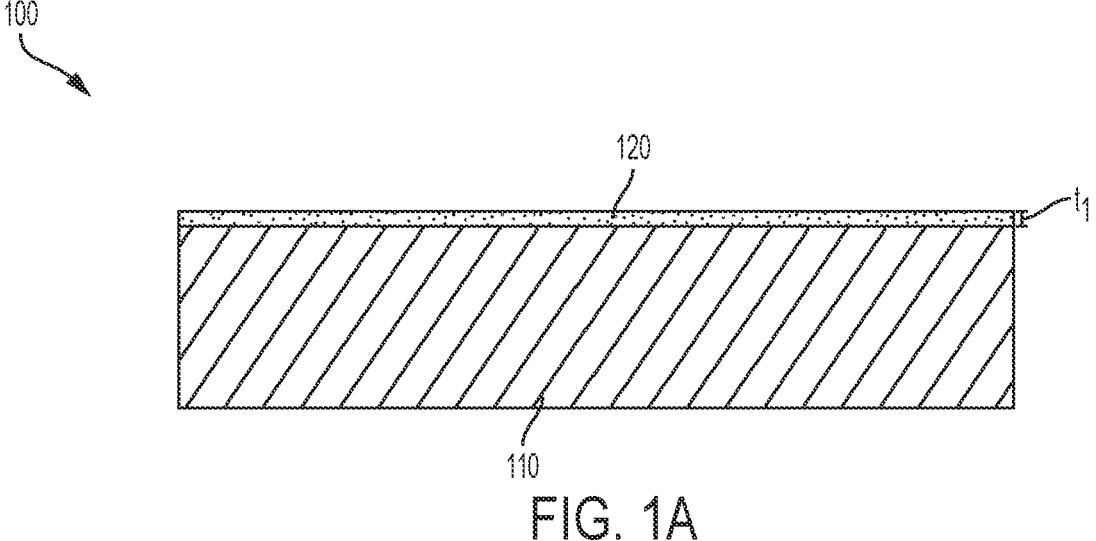
FIG. 1A illustrates a cross-sectional view of an embodiment, such as a lid, including a corrosion-resistant component according to an example aspect of the invention.

A ceramic substrate and a corrosion-resistant layer comprising a rare earth compound are sintered together to form a dense corrosion-resistant laminate or corrosion-resistant component. This is to solve the problem of coatings (via plasma spray coating operation, for example) being applied to previously sintered substrates, wherein the coating subsequently suffers from problems such as spalling or shedding particles during use. In an example aspect, the heat treating of a thin rare earth compound layer on a suitable substrate material provides a corrosion-resistant component. In another example aspect, the rare earth compound is yttrium oxide and the substrate material is a ceramic, such as aluminum oxide. In yet another example aspect, the rare earth compound comprises a rare earth silicate such as yttrium silicate on an aluminum nitride substrate. In an example aspect, a corrosion-resistant layer including a rare earth compound is cosintered with insulating substrate materials to form corrosion-resistant ceramic lids, for example, that are commonly interposed between induction coils and induction plasma used for etching. In other example aspects, corrosion-resistant components useful as insulating rings surrounding the wafer chuck and other chamber parts in etch and deposition reactors, such as wafer heaters and deposition showerheads, also benefit from this technology. Components, assemblies and methods of the present disclosure provide a way to meet the need for physically and chemically stable, corrosion-resistant layers and parts such as ceramic lids integral to the plasma reactors used in the semiconductor industry.

As used herein, various terms are defined as follows. "Alumina" is commonly understood to be aluminum oxide, substantially comprising $Al_2O_3$. "Yttria" is commonly understood to be yttrium oxide, substantially comprising $Y_2O_3$. "Ytterbia" is commonly understood to be ytterbium oxide, substantially comprising $Yb_2O_3$. The term "substantially" generally refers a purity of $\geq 90$ wt %, preferably $\geq 91$ wt % or $\geq 92$ wt % or $\geq 93$ wt % or $\geq 94$ wt % or $\geq 95$ wt % or $\geq 96$ wt % or $\geq 97$ wt % or $\geq 98$ wt % or $\geq 99$ wt % or about 100 wt %. The term "about" generally refers to plus or minus 10% of the indicated number. For example, "about 10%" may indicate a range of 9% to 11%, and "about 20" may mean from 18-22. Other meanings of "about" may be apparent from the context, such as rounding off, so, for example "about 1" may also mean from 0.5 to 1.4. The term "soak" (see Tables in the Examples) refers to the holding time at a particular temperature or pressure in a hot pressing cycle.

Other definitions include the following. "Adhesion strength" is measured by the ASTM C633 method. "Loss tangent" is the ratio of the imaginary part of the dielectric constant to the real part; it is directly proportional to the power absorbed by the component. "Color" is described using the 1976 CIELAB color space: this reduces colors to a lightness/darkness variable L*, for which absolute black is 0 and complete white is 100, and other parameters a* and b* which describe the hue of the object. Generally, an object having L* greater than 85 and absolute values of a* and b* of less than 7 are considered "white". "Porosity" is measured by image analysis of a polished section, polished according to the following scheme (polishing supplies provided by Struers, Inc.): (i) 60 pm diamond: as needed to flatten the surface; (ii) 15 μm diamond, fixed abrasive pad: 2 min; (iii) 9 μm diamond, Largo (plastic) pad: 8 min; (iv) 3 μm diamond, DAC (nylon) pad: 6 min; and, (v) 1 μm diamond, napped cloth: 3 min. "Grain size" is measured by the by ASTM-E112 method. "Green" or "unsintered" ceramics as referred to herein include ceramic materials and powders which have not been densified via a high temperature thermal process. "Sintered" or "Cosintered" refers to one or more ceramic materials that have been exposed to a high temperature thermal process to promote sintering. "Sintering" is a thermal or heat treatment process to promote material transport and densification through the gradual elimination of porosity. The sintering process is used to produce materials with controlled microstructure and porosity. "Coating" is a layer applied to a substrate, for example, a sintered substrate. "Laminate" or "composite laminate" is an assembly of layers that are joined via a process such as sintering, for example. "Component" is a part or product.

A reactor for semiconductor fabrication or semiconductor processing is useful for etching or deposition or both. A reactor is referred to interchangeably herein as a semiconductor processing reactor, a semiconductor fabrication reactor, or simply as reactor. Reactors are useful for plasma etching or deposition or both. In an example aspect, both the ceramic insulating substrate and the corrosion-resistant non-porous layer are resistant to a plasma etching treatment employed in semiconductor processing. In an example aspect, the corrosion-resistant component is a lid for a plasma etch reactor. Reactors used for deposition periodically run an etching process for cleaning of the reactor. In an example aspect, the reactor is a deposition reactor configured for in-situ cleaning with halogen gases and the corrosion-resistant component is a heater. In another example aspect, the reactor is a deposition reactor configured for in-situ cleaning with halogen gases and the corrosion-resistant component is a showerhead.

Ceramics are inorganic, non-metallic materials known for their ability to withstand high temperatures. Ceramics include oxides, non-oxides and composites (combinations of oxides and non-oxides). Oxides include, in non-limiting examples, alumina, glass-ceramics, beryllia, mullite, ceria, and zirconia. In a preferred embodiment the ceramic oxide is alumina ($Al_2O_3$). Non-oxides include carbides, borides, nitrides, and silicides. In another preferred embodiment, the non-oxide is a nitride, such as aluminum nitride (AlN). Ceramic oxides, non-oxides, and composites are useful as substrates.

A corrosion-resistant layer including a rare-earth element or compound is advantageously joined with a ceramic substrate and/or other layers to provide a laminate, wherein the outermost layer is corrosion-resistant and non-porous. Examples of rare-earth compounds include, but are not limited to trivalent rare earth oxides such as in an example embodiment, yttrium oxide ($Y_2O_3$). In other example embodiments, the rare earth compound is selected from the group consisting of yttrium oxide, yttrium silicates, yttrium fluorides, yttrium oxyfluorides, yttrium aluminates, nitrides, complex nitride compounds, and combinations of two or more thereof. In an example aspect, the rare earth compound is $Y_3Si_3O_{10}F$. In other example aspects, the rare earth compound is a complex nitride compound such as YN $Si_3N_4$ or YN AlN $Y_2O_3$ $2SiO_2$, for example.

Sintering aids, as known to one of skill in the art, are useful for example to minimize porosity, reduce grain size, and/or to enable less extreme processing conditions to be employed (for example, lower pressures in hot pressing) for sintering. In an example aspect, a sintering aid is added to the rare-earth compound. In an example aspect, the sintering aid added to the rare-earth compound is an oxide of tetravalent elements (e.g. Zr, Hf, Ce). In an example aspect, the amount of sintering aid added to the rare-earth compound is in the range from about 300 ppm to about 20% by weight based upon total weight of the rare-earth compound; in another example aspect from about 0.5% by weight to about 15% by weight based upon total weight of the rare-earth compound. In an example aspect, the amount of sintering aid added to the rare-earth compound is about 1% by weight, or about 2% by weight, or about 5% by weight, or about 10% by weight, or about 15% by weight. In an example aspect, the sintering aid added to the rare-earth compound is $ZrO_2$ or $HfO_2$. In an example aspect, where the rare-earth compound is yttria, for example, $ZrO_2$ is used as a sintering aid in the amount of about 1% by weight based upon total weight of the rare-earth compound. In another example aspect, $ZrO_2$ is used as a sintering aid in the amount of about 15% by weight based upon total weight of the rare-earth compound. In an example aspect for processing large parts such as a lid, for which maintaining pressure levels is challenging, about 1% by weight sintering aid is added to the rare-earth compound based upon total weight of the rare-earth compound.

Interposing layers can be placed between the substrate and the rare-earth compound containing corrosion-resistant layer in assembling the laminate. In an example aspect, at least one interposing layer between a yttria layer and an alumina substrate is useful in order to detect wear of the outermost corrosion-resistant layer. Interposing layers may also advantageously include a rare-earth element or compound. In one embodiment, ytterbium oxide ($Yb_2O_3$) is used as an interposing layer since its fluorescence at infrared (IR) wavelengths can be used to detect corrosion-resistant layer wear without producing a cosmetic color change of the material. As owners of semiconductor equipment frequently care about cosmetic issues, $Yb_2O_3$ layers offer the advantage of not being visible to the human eye (in other words colorless) while allowing detection of wear by irradiating with appropriate IR wavelengths and observing the fluorescence or absorption. The thickness of interposing layer(s) depends on function; typically interposing layers are at most about 2 μm in thickness. In an example aspect, interposing layers such as conductive layers or bonding layers function acceptably at thicknesses of less than 10 μm.

In another example aspect, a sintering aid is added to the interposing layer. In an example aspect, the sintering aid added to the interposing layer is an oxide of tetravalent elements (e.g. Zr, Hf, Ce). In an example aspect, the amount of sintering aid added to the interposing layer is in the range from about 300 ppm to about 20% by weight based upon total weight of the interposing layer; in another example aspect from about 0.5% by weight to about 15% by weight based upon total weight of the interposing layer. In an example aspect, the amount of sintering aid added to the interposing layer is about 1% by weight, or about 2% by weight, or about 5% by weight, or about 10% by weight, or about 15% by weight. In an example aspect, the sintering aid added to the interposing layer is a material chosen from $ZrO_2$, $HfO_2$, and $CeO_2$. In other embodiments, the sintering aid is at least one material chosen from $ZrO_2$, $HfO_2$, $CeO_2$, and mixtures of two or more thereof. In another example, the sintering aid includes inert material such as a non-limiting example wherein zirconia as sintering aid further includes yttria, as in yttria stabilized zirconia. In an example aspect, where the interposing layer is $Yb_2O_3$, for example, $ZrO_2$ is used as a sintering aid in the amount of about 1% by weight based upon total weight of the interposing layer. In another example aspect, $ZrO_2$ is used as a sintering aid in the amount of about 15% by weight based upon total weight of the interposing layer. In an example aspect for processing large parts such as a lid, for which maintaining pressure levels is challenging, about 1% by weight sintering aid is added to the interposing layer based upon total weight of the interposing layer.

In an example aspect, the interposing layer includes a grain size in the range from 0.1 μm to 30 μm. In an example aspect, the grain size of the interposing layer is at least 0.1 or at least 0.3 μm, or at least 0.5 μm, or at least 1 μm, or at least 2 μm, or at least 4 μm. In an example aspect, the grain size of the interposing layer is at most 30 μm, or at most 20 μm, or at most 15 μm, or at most 10 μm, or at most 6 μm, or at most 5 μm. The porosity of the interposing layer is at most about 3%, or at most about 2%, or at most about 1%. In an example aspect, the interposing layer is ytterbia ($Yb_2O_3$). The porosity of the interposing layer should be sufficiently low, but does not need to be as low as the porosity of the corrosion-resistant non-porous layer. This is because the interposing layer is not exposed to the processes such as plasma etching or deposition as is the corrosion-resistant non-porous layer.

Optionally, it may also be advantageous to include metal layers in the ceramic lid, insulating rings and other chamber parts that are commonly found in etching and deposition equipment. As noted above, ceramic lids, which are also referred to as ceramic windows or simply as lids or windows interchangeably herein, are commonly interposed between induction coils and induction plasma used for etching. The electrical resistance of a metal layer could also serve to monitor the temperature of the lid, thus enabling feedback control over its temperature. Embedding or interposing the layers within the lid or component simplifies the assembly of the system and also improves shielding and the coupling of the heat to the lid.

It is important to choose the materials of the embedded layers to match the thermal expansion coefficient of the bulk composite as well as to the individual layer(s) of the composite as mismatches tend to lead to delayed delamination within the component. Thermal expansion mismatches can be considered close or acceptable if the difference in thermal expansion coefficients is at most $4 \times 10^{-6}$/K relative to the coefficients for the ceramic insulating substrate and the corrosion-resistant non-porous layer. In an example aspect, the at least one interposing layer is chosen to be a material having a thermal expansion coefficient difference of at most at most $4 \times 10^{-6}$/K relative to the coefficients for the ceramic insulating substrate and the corrosion-resistant non-porous layer. Thermal expansion mismatches can often be helped by making the layer a composite of several different materials, whose combined thermal expansion matches the expansion of the bulk of the part. In an example aspect, $MoSi_2$ is a particularly suitable conductive intermetallic compound, because its thermal expansion is close to that of alumina, and it does not react with alumina at the high processing temperatures.

Since the components of the invention may operate in strong electromagnetic fields, minimizing the loss tangent is an important consideration. In an example aspect, the corrosion-resistant component has a loss tangent of the component of at most $1 \times 10^{-3}$, preferably at most $1 \times 10^{-4}$. A component having a loss tangent of at most $1 \times 10^{-4}$ is substantially transparent to radio-frequency (RF) energy. Excessive carbon content in the parts tends to promote high loss tangent and therefore carbon content should be minimized. Free carbon contents in excess of 2000 ppm are undesirable. In one embodiment the carbon content is at most 1500 ppm. In another embodiment the carbon content is at most 1000 ppm. In a further embodiment the carbon content is at most 500 ppm. Very low levels of carbon, for example at most 200 ppm carbon content by weight, are believed to also contribute to desirably light or white components according to the present disclosure. In one embodiment the carbon content is at most 200 ppm. In another embodiment the carbon content is at most 100 ppm. In yet another embodiment the carbon content is at most 50 ppm.

The presence or exposure to certain elements during the semiconductor processing, for example, can be undesirable. In applications for which light-colored ceramic components are desired, due to industry users being sensitive to the color of the components or parts as with semiconductor processing, undesired elements are to be avoided. Metal contamination in the parts (which affects the properties of transistors in the wafers processed in the equipment) can be visible as dark spots on the parts. Thus lighter colors for the parts are preferred as the spots show up more clearly. This enables problem or unacceptable parts to be identified and discarded before use. In an example aspect, the corrosion-resistant component has a CIE Lab color L* parameter of at least 50. In another example aspect, the corrosion-resistant component has a CIE Lab color L* parameter of at least 80.

In an example aspect, the disks, windows, and/or components of the present disclosure are characterized as being "white" in color. Advantageously, uniformly white components of the present disclosure can be associated with defect free or substantially defect free components. That is because consumers in the semiconductor industry, for example, have typically observed defects to be non-white and a white component according to the present disclosure provides a white background by which defects are more readily detected with the human eye. Therefore, undesirable components can be culled out if need be rather than to be used in processing. White, defect free components are hence desirable to the consumer. Particularly desired is that the planar surface of the white component that is exposed to or facing a wafer to be processed, in a non-limiting example, be white.

Alternatively, or in addition to the component being characterized as white, the outer most layer of the component is characterized as being "white" in color. For components of the present invention, the outer most layer of the component corresponds to a corrosion-resistant non-porous outer layer, and is referred to herein as white corrosion-resistant non-porous outer layer or simply as white outer layer. Lightness of color and color uniformity may be observed visually by the eye. Alternatively, color and uniformity of color may be measured. As those skilled in the art appreciate, the color of the components may be measured, in a non-limiting example, by using standard instrumentation such as Hunterlab Miniscan XE instrument using the CIELAB L*a*b* scale. CIELAB L*a*b* values are also referred to as CIE Lab values or L*, a*, b* values interchangeably herein. Values for "L*" indicate the ratio of light to dark or, in other words, 'shading'. Values for "a*" and "b*" generally relate to 'hue'. Values for "a*" refer to the redness-greenness coordinate in certain transformed color spaces, generally used as the difference in "a*" between a specimen and a standard reference color. If "a*" is positive, there is more redness than greenness; if "a*" is negative, there is more greenness than redness. The value for a* is normally used with b* as part of the chromaticity or chromaticity color difference. Values for "b*" refer to the yellowness-blueness coordinate in certain color spaces, generally used as the difference in "b*" between a specimen and a standard reference color, normally used with "a*" or a as part of the chromaticity difference. Generally, if "b*" is positive, there is more yellowness than blueness; if "b*" is negative, there is more blueness than yellowness. In an example aspect, the disks, windows, and/or components of the present disclosure are white in color. In one or more embodiments, the component has an L* value of at least 88, in other embodiments an L* value of at least 90, in other embodiments an L* value of at least 92, and in other embodiments an L* value of at least 94. The measured CIELAB L*a*b* values are obtained on a planar surface of the outer most layer of the component. In an example aspect, the corrosion-resistant non-porous outer layer of the component is white. In one or more embodiments, the corrosion-resistant non-porous outer layer of the component has an L* value of at least 88, in other embodiments an L* value of at least 90, in other embodiments an L* value of at least 92, and in other embodiments an L* value of at least 94.

First row transition elements such as V, Cr, Mn, Fe, Co, Ni, Cu, and Zn, for example, diffuse relatively quickly through silicon and can alter the electrical properties of devices. The presence of Au and Ag can cause similar problems. In addition, elements such as Li, Na, and K diffuse quickly through silica and can affect the charge density on device gates. The corrosion-resistant component of the invention is substantially contaminant free. Total concentration of undesirable elements in the raw materials for making corrosion-resistant components is to be minimized. The total concentration of these undesirable elements should be substantially less than 1 at %. In an example aspect, the total concentration of undesirable elements in raw materials used in making of the corrosion-resistant components is at most 1 at %.

Layer thickness for the outermost layer may be tailored to the component and its application for use. The outermost layer is the corrosion-resistant non-porous layer. Depending upon use, the outermost layer may be oriented toward the inside of a chamber or reactor, for example. For lids or windows, which are typically larger than 500 μm in diameter, relatively thick layers are desired. The as-fired profile of such a large component may depart by a millimeter or more from the desired profile; therefore, it is desirable for the as-fired thickness of the outermost layer to be substantially more than one millimeter thick, in order to ensure the presence of enough outermost material even after grinding. Thinner layers are more appropriately used on smaller parts, because departures from the true form are typically less.

One example aspect of the invention is directed to a corrosion-resistant component configured for use with a semiconductor processing reactor, the corrosion-resistant component comprising: a) a ceramic insulating substrate; and, b) a corrosion-resistant non-porous layer associated with the ceramic insulating substrate, the corrosion-resistant non-porous layer having a composition comprising at least 15% by weight of a rare earth compound based on total weight of the corrosion-resistant non-porous layer; and, the corrosion-resistant non-porous layer characterized by a microstructure substantially devoid of microcracks and fissures, and having an average grain size of at least about 100 nm and at most about 100 μm. In an example aspect, the corrosion-resistant non-porous layer associated with the ceramic insulating substrate is adhered to the substrate. In an example aspect, the corrosion-resistant non-porous layer is adhered directly to the substrate. In another example aspect, the corrosion-resistant non-porous layer is adhered indirectly to the substrate, for example with interposing layers therebetween.

The microstructure of the corrosion-resistant non-porous layer is important to the durability and performance of the component. A component or laminate including a non-porous layer free of microcracks and fissures does not suffer deleterious effects such as particle shedding. In an example aspect, the corrosion-resistant non-porous layer is characterized by a microstructure devoid of microcracks and fissures. In another example aspect, the corrosion-resistant non-porous layer is characterized by a microstructure substantially devoid of microcracks and fissures. In an example aspect, the corrosion-resistant non-porous layer has microcracks and fissures of less than 50 per mm$^2$, in an example aspect less than 10 per mm$^2$, in another example aspect less than 5 per mm$^2$, and in yet another example aspect less than 1 per mm$^2$. In an example aspect, the corrosion-resistant non-porous layer is characterized by a microstructure having microcracks and fissures of at most 1 per mm2, as quantified by image analysis, for example, or other methods as known in the art. Whereas microcracks and fissures are deleterious to the microstructural integrity of the corrosion-resistant non-porous layer, second phases in the microstructure may conversely increase strength of the layer (refer to Example 10).

In an example aspect, grain size of the corrosion-resistant non-porous layer is important to the performance of the component. Generally, corrosion occurs fastest at grain boundaries, thus materials with larger grain sizes corrode more slowly. In addition, if corrosion on boundaries is relatively rapid, entire grains can be dislodged by grain boundary corrosion. This is also referred to herein as particle loss or shedding. In an example aspect, the corrosion-resistant component includes a corrosion-resistant non-porous layer having an average grain size as measured by ASTM-E112 of at least 100 nm. In an example aspect, the corrosion-resistant non-porous layer is characterized as having an average grain size of at least 100 nm, or at least 150 nm, or at least 200 nm, or at least 300 nm, or at least 500 nm. However, problems may develop with overly large grain sizes, for example, the size of flaws weakening the material scales as the grain size; therefore, grain sizes larger than 100 μm are also undesirable. In an example aspect, the corrosion-resistant non-porous layer is characterized as having an average grain size of at most 100 μm, or at most 30 μm, or at most 10 μm, or at most 1 μm, or at most 750 nm. Alternatively, the average grain size of the corrosion-resistant non-porous layer is in the range of about 100 μm to about 100 μm, preferably about 200 μm to about 50 μm, more preferably about 300 μm to about 30 μm. In another example aspect, the average grain size of the corrosion-resistant non-porous layer is at least 300 nm and at most 30 μm.

In an example aspect, grain size of the corrosion-resistant non-porous outer layer is important to the color of the component, particularly wherein a white component is desired. Without being bound by theory, it is believed that a uniform average grain size provides color uniformity, whereas the presence macroscopic areas (e.g. greater than 1 mm$^2$) of large grain sizes and macroscopic areas (e.g. greater than 1 mm$^2$) of small grain sizes within the layer may cause deleterious color variations. A smaller average grain size is believed to be advantageous in terms of providing color uniformity. This is believed to relate to transparency of the grains in the outer layer. The density of grain boundaries is less for a layer having a larger average grain size as compared to a layer having a smaller average grain size leading to more transparency for the layer comprising a larger average grain size. More transparency means that the outer layer transmits more light through from the material beneath the corrosion-resistant non-porous outer layer, ie. from the substrate, and may lead to lessening of the desired color lightness (or whiteness) or uniformity. In an example aspect, a component characterized as white in color according to the present disclosure include a corrosion-resistant non-porous outer layer having an average grain size of at most 100 μm, at most 50 μm, or at most 30 μm, or at most 20 μm, or at most 10 μm, or at most 8 μm, or at most 6 μm. In an example aspect, a component characterized as white in color according to the present disclosure include a corrosion-resistant non-porous outer layer having an average grain size of at least 500 μm, or at least 1 μm, or at least 2 μm, or at least 4 μm. Alternatively, the average grain size of the corrosion-resistant non-porous layer is in the range of about 500 μm to about 100 μm, preferably about 1 μm to about 50 μm, more preferably about 2 .tm to about 10 μm. In another example aspect, the average grain size of the corrosion-resistant non-porous layer is about 5 μm. Achieving acceptable color and/or color uniformity is challenging as components get larger, as those of skill and knowledge of in the art would recognize. In other words, it is more difficult to achieve uniform color on larger parts than smaller parts. In one embodiment of the present disclosure, uniformly white components are achieved for a component having a diameter of at least 400 μm, or in other embodiments at least 500 μm.

In an example aspect, the corrosion-resistant component includes a corrosion-resistant non-porous layer having: a) a porosity of ≤2%, preferably ≤1% or ≤0.9% or ≤0.8% or ≤0. 7% or ≤0.6% or ≤0.5% or ≤0.4% or ≤0.3% or ≤0.2% or ≤0.1%; and b) an adhesion strength of ≥15 MPa, preferably ≥20 MPa or ≥25 MPa or ≥30 MPa or ≥35 MPa or ≥40 MPa; and c) a layer thickness of ≥50 μm, preferably ≥100 μm or ≥150 μm or ≥200 μm or ≥250 μm or ≥300 μm. Layer thickness, as mentioned previously, may be tailored to the application of use or component specifications desired. Alternatively, the layer thickness can be in the range of about 50 to about 500 μm, preferably about 100 to about 400 μm, more preferably about 150 to about 300 μm. In an example aspect, the corrosion-resistant non-porous layer has: a porosity of at most 1%; an adhesion strength of at least 20 MPa; and, a layer thickness of at least 50 μm. In another example aspect, the corrosion-resistant non-porous layer has: a porosity of at most 0.5%; an adhesion strength of at least 30 MPa; and, a layer thickness of at least 100 μm.

Figure 1B:
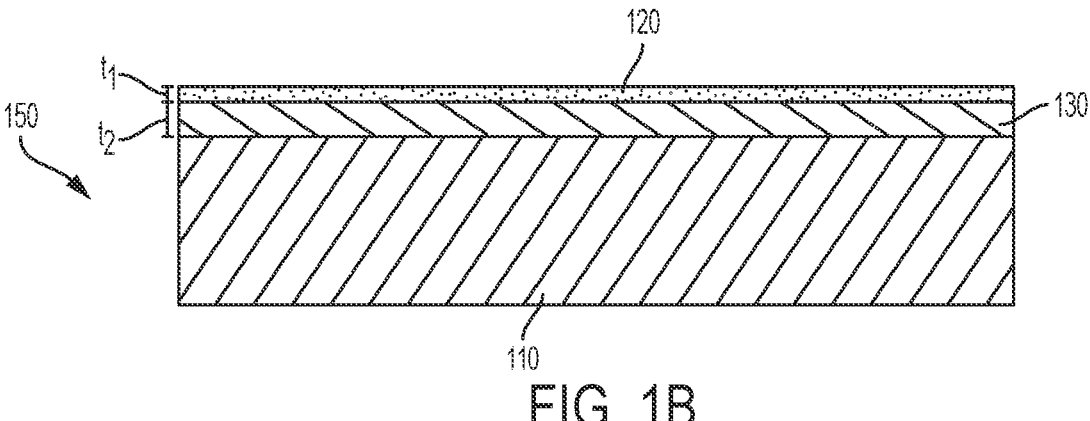
FIG. 1B illustrates a cross-sectional view of an embodiment, such as a lid, including a corrosion-resistant component according to another example aspect of the invention.

FIGS. 1A and 1B illustrate cross-sectional schematic views of example aspects of corrosion-resistant components. In FIG. 1A, corrosion-resistant component 100 includes substrate 110 having corrosion-resistant non-porous layer 120 adjacent to the substrate 110 where layer 120 provides an outermost layer for the component. Layer 120 has thickness $t_1$. In FIG. 1B, corrosion-resistant component 150 includes substrate 110 having interposing layer 130 situated between substrate 110 and corrosion-resistant non-porous layer 120. Layer 130 has thickness $t_2$. In one embodiment of the corrosion-resistant component both the substrate and the corrosion-resistant non-porous layer are resistant to the plasma etching conditions employed in semiconductor processing.

In an example aspect, as shown in FIG. 1A, corrosion-resistant component 100 includes non-porous corrosion-resistant layer 120 comprising a rare earth compound. In an example aspect, layer 120 comprises a trivalent rare earth oxide. In another example aspect, the rare earth compound is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof. In another example aspect, the rare earth compound is a complex nitride compound such as, for example, YN $Si_3N_4$ or YN $Y_2O_3$ $2SiO_2$.

In an example aspect, the corrosion-resistant component includes ceramic insulating substrate 110, as shown also in FIG. 1A, selected from the group consisting of aluminum oxide ("alumina", also $Al_2O_3$), aluminum nitride, silicon nitride, silicate-based materials and mixtures of two or more thereof In an example aspect, for applications requiring high strength, for example, the substrate may further include zirconia ($ZrO_2$). In an example aspect, the ceramic insulating substrate is aluminum oxide. In an example aspect, the ceramic insulating substrate consists essentially of aluminum oxide. In an example aspect, the ceramic insulating substrate is aluminum oxide and the rare earth compound is a trivalent rare earth oxide. In another example aspect, the ceramic insulating substrate is aluminum nitride and the corrosion-resistant non-porous layer is a rare earth silicate.

In an example aspect, the corrosion-resistant non-porous layer is adhered to the ceramic insulating substrate, and the corrosion-resistant non-porous layer has: a porosity of at most 1%; an adhesion strength of at least 20 MPa; and, a thickness of at least 50 μm. In another example aspect, the corrosion-resistant non-porous layer is adhered to the ceramic insulating substrate, and the corrosion-resistant non-porous layer has: a porosity of at most 0.5%; an adhesion strength of at least 30 MPa; a thickness of at least 100 μm; and, an average grain size of at least about 300 μm and at most about 30 μm.

In an example aspect, corrosion-resistant component 100 is a lid configured for releasable engagement with a plasma etch reactor. In an example aspect, the corrosion-resistant component or lid has a loss tangent of less than $1 \times 10^{-4}$. In an example aspect, ceramic insulating substrate 110 and corrosion-resistant non-porous layer 120 are substantially transparent to radio-frequency (RF) energy. In an example aspect, ceramic insulating substrate 110 and corrosion-resistant non-porous layer 120 are transparent to radio-frequency (RF) energy.

In an example aspect, corrosion-resistant component 150, as shown in FIG. 1B, includes at least one interposing layer 130 selected from the group consisting of rare earth oxides, rare earth silicates, rare earth aluminates, and mixtures of two or more thereof. In an example aspect, the at least one interposing layer 130 is ytterbium oxide ($Yb_2O_3$). In an example aspect, the at least one interposing layer comprises conducting materials. In an example aspect, the at least one interposing layer further comprises insulating materials.

In an example aspect, the at least one interposing layer is adhered to both the corrosion-resistant non-porous layer and to the ceramic insulating substrate, and the corrosion-resistant non-porous layer has: a porosity of at most 1%; an adhesion strength of at least 20 MPa; and, a thickness of at least 50 μm. In another example aspect, the at least one interposing layer is adhered to both the corrosion-resistant non-porous layer and to the ceramic insulating substrate, and the corrosion-resistant non-porous layer has: a porosity of at most 0.5%; an adhesion strength of at least 30 MPa; a thickness of at least 100 μm; and, an average grain size of at least about 300 μm and at most about 30 μm.

In an example aspect, at least one interposing layer is either embedded in the ceramic insulating substrate 110 (see FIG. 3, layers 340, 360), or between and adhered to both the substrate and the corrosion-resistant non-porous layer 120 (see FIG. 1B). In an example aspect, the interposing layer is selected from the group consisting of rare earth oxides, rare earth silicates, rare earth aluminates and mixtures of two or more thereof A rare earth oxide suitable as an at least one interposing layer is ytterbium oxide ($Yb_2O_3$). In another example aspect, the interposing layer comprises conducting materials, which can optionally further comprise insulating materials. With regard to the conducting materials, for most applications direct current (DC) or low frequency, for example less than 100 MHz, conductivity is required. Conducting metal layers are useful as actively driven electrodes or as a passive RF shield. The insulating materials are generally selected from the group consisting of alumina, aluminum nitride, silicon nitride, aluminates, silicates, and mixtures of two or more thereof, although any material compatible with the processing of the part and the metals in the layer could be also used; the reasons to add materials to the conducting layer can include obtaining better thermal expansion match to the rest of the part and improving the adhesion between the layer and the rest of the part. In the case where conducting materials are used, the layer will usually have large openings in it to allow RF energy to pass through. In other words, in an example aspect, an interposing layer such as a conductive layer is non-continuous. In one embodiment of the corrosion-resistant component the substrate and the corrosion-resistant non-porous layer are substantially transparent to radio-frequency (RF) energy.

In an example aspect, and prior to heat treatment, a green laminate configured for use with a semiconductor processing reactor comprises a first layer of green sinterable material and a second layer of green sinterable material including a rare earth compound. In an example aspect, the first layer of green sinterable material is selected from the group consisting of aluminum oxide, aluminum nitride, silicon nitride, silicate-based materials, and mixtures of two or more thereof. In an example aspect, the second layer of green sinterable material comprises a trivalent rare earth oxide. In another example aspect, the second layer comprises a rare earth compound selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof. In an example aspect, upon heat treatment of the laminate, the second layer has a porosity of at most 1% and an average grain size of at least 100 μm and at most 100 μm. In another example aspect, upon heat treatment of the laminate, the second layer has a porosity of at most 0.5%. In an example aspect, upon heat treatment of the laminate, the average grain size of the second layer is at least 300 μm and at most 30 μm.

In an example aspect, the green laminate further includes at least one interposing layer between the first and second layers, wherein the interposing layer comprises green sinterable material selected from the group consisting of rare earth oxides, rare earth silicates, rare earth aluminates, and mixtures of two or more thereof. In an example aspect, the green laminate further includes at least one interposing layer wherein the at least one interposing layer comprises conducting materials. In an example aspect, the green laminate further includes at least one interposing layer wherein the at least one interposing layer comprises insulating materials. In an example aspect, the heat treatment for the green laminate is selected from the group consisting of hot pressing and hot isostatic pressing. After heat treatment, the heat treated or sintered laminate including interposing layer(s) has an adhesion strength of at least 15 MPa, or at least 20 MPa, or at least 25 MPa, or at least 30 MPa, or at least 35 MPa, or at least 40 MPa.

Figure 2:
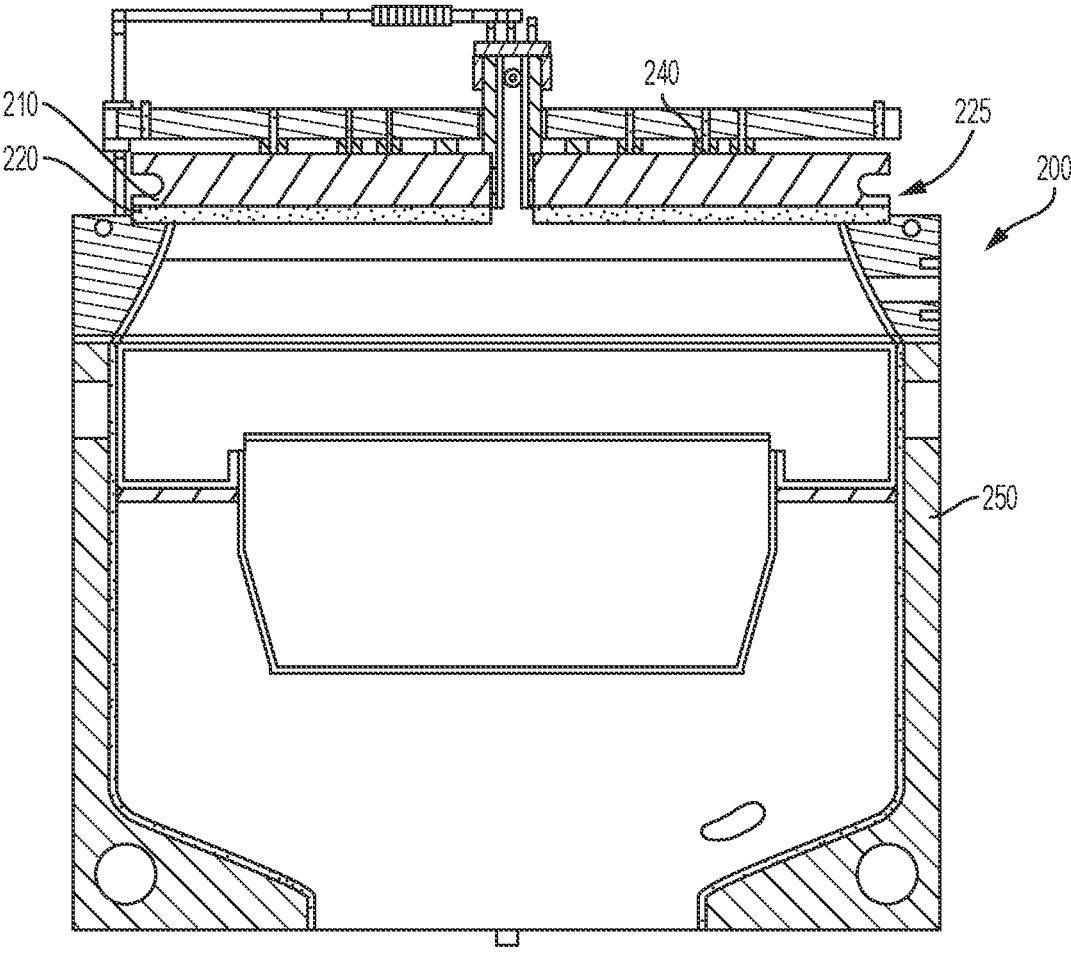
FIG. 2 illustrates an assembly for plasma etching of semiconductor chips, including a corrosion-resistant lid according to an example aspect of the invention.

FIG. 2 illustrates an example aspect of an assembly configured for use in plasma etching semiconductor wafers. Plasma etch reactor assembly 200 includes plasma etch reactor 250. Alternating magnetic fields generated by induction coils 240 extend through lid 225, creating electric fields inside reactor 250 directly under lid 225, which in turn create the etch plasma. Corrosion-resistant lid 225 is configured for releasable engagement with plasma etch reactor 250. Lid 225 includes a corrosion-resistant ceramic insulating substrate 210 having an inner surface and an outer surface; and, further includes corrosion-resistant non-porous layer 220, which is adjacent to the inner surface of substrate 210. Corrosion-resistant non-porous layer 220, having inner and outer planar surfaces, is positioned so that the inner planar surface of layer 220 faces the interior of reactor 250. Optionally, interposing layer(s) (example layer 130 as shown in FIG. 1B) are situated between substrate 210 and corrosion-resistant non-porous layer 220. In an example aspect, layer 220 comprising a rare earth compound, wherein the non-porous layer is adhered to the corrosion-resistant substrate and has 1) an adhesion strength of ≥15 MPa, preferably ≥20 MPa or ≥25 MPa or ≥30 MPa or ≥35 MPa or ≥40 MPa, 2) a thickness of ≥50 μm, preferably ≥100 μm or ≥150 μm or ≥200 μm or ≥250 μm or ≥300 μ,m; alternately a thickness in the range of about 50 to about 500 μm, preferably about 100 to about 400 μm, more preferably about 150 to about 300 μm, and 3) a porosity of ≤2%, preferably ≤1% or ≤0.9% or ≤0.8% or ≤0.7% or ≤0.6% or ≤0.5% or ≤0. 4% or ≤0.3% or ≤0.2% or ≤0.1%. In an example aspect, layer 220 includes at least 15% by weight based on total weight of layer of a rare earth compound. In example aspect, layer 220 includes an adhesion strength of at least 20 MPa; a porosity of at most 1%; a microstructure substantially devoid of microcracks and fissures and an average grain size of at least 100 μm and at most 100 μm; and, a layer thickness of at least 50 μm. In another example aspect, the grain size is at least 300 μm and at most 30 μm.

In an example aspect, lid 225 of the assembly includes layer 220, wherein the rare earth compound is selected from the group consisting of yttrium oxide (Y$_2$O$_3$), yttrium silicates, yttrium fluorides, yttrium oxyfluorides, yttrium aluminates, nitrides, complex nitride compounds and combinations of two or more thereof. In another example aspect, the assembly includes the corrosion-resistant ceramic insulating substrate 210, wherein the substrate is selected from the group consisting of aluminum oxide, aluminum nitride, silicon nitride, silicate-based materials and mixtures of two or more thereof.

Another embodiment of the assembly further comprises an interposing layer embedded in the substrate, or an interposing layer between and adhered to both the corrosion-resistant substrate and the non-porous layer. In an example aspect, the interposing layer may serve one or more functions, for example, to promote adhesion between the non-porous layer and the substrate, to prevent an adverse reaction between the non-porous layer and the substrate, and/or to provide some electrical function for the assembly. In other example aspects, for applications involving very high electric fields as required for particular lids, high electrical resistivity is desirable to prevent losses affecting processing, and therefore, an interposing layer such as ytterbium oxide (Yb$_2$O$_3$) can be beneficial.

In an example aspect, the interposing layer is selected from the group consisting of ytterbium oxide (Yb$_2$O$_3$), MoSi$_2$, radio-frequency (RF) conducting materials and mixtures of two or more thereof. Preferably the corrosion-resistant lid of the assembly is substantially transparent to radio-frequency (RF) energy. The assembly, including the corrosion-resistant lid, is preferably resistant to the plasma etching treatment employed in semiconductor processing. Thus, the corrosion-resistant substrate and the corrosion-resistant non-porous layer of corrosion-resistant lid of the assembly are resistant to the plasma etching treatment employed in semiconductor processing.

Figure 3:
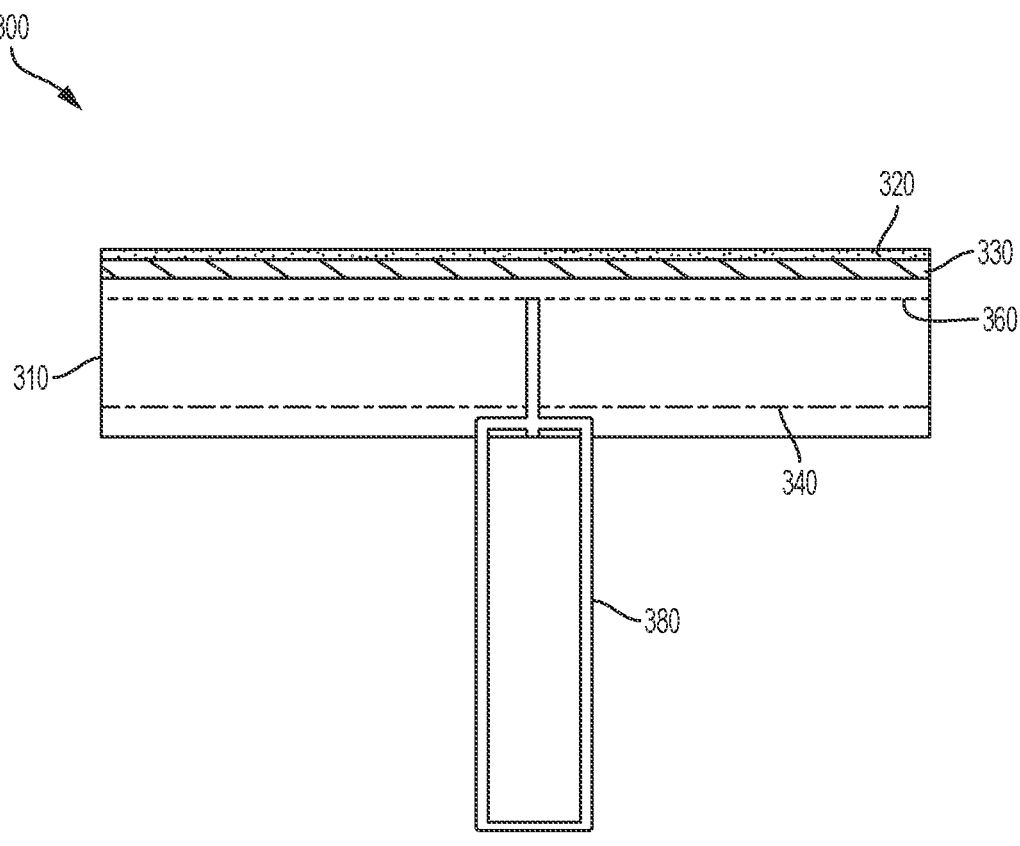
FIG. 3 illustrates a cross-sectional view of a corrosion-resistant wafer heater according to an example aspect of the invention; and, FIG. 4 illustrates a chemical vapor deposition reactor assembly including a wafer heater and a showerhead, each including a corrosion-resistant non-porous layer, according to an example aspect of the invention.

Another aspect of the invention is directed to a high temperature corrosion-resistant wafer heater. FIG. 3 illustrates a cross-sectional schematic view of wafer heater apparatus 300 as in an example aspect. The wafer (not shown) sits on the outermost layer (320) of insulating ceramic disk 310 having heating elements 340 embedded therein and also, optionally, metal RF shield 360. In an example aspect insulating ceramic 310, from which these heaters are made, is aluminum nitride. In other example aspects, alumina or silicon nitride is useful as ceramic insulating substrate 310. During operation, the heater is sometimes cleaned with fluorine-containing gas. If the temperature of the heater exceeds about 500 C, then the heater itself may be attacked by the fluorine thus making a corrosion-resistant protective layer included onto the 'hot' parts necessary. In an example aspect, insulating ceramic 310 includes corrosion-resistant non-porous layer 320 and optional interposing layer 330 therebetween. Corrosion-resistant non-porous layer 320 includes an outer surface for holding the wafer (not shown). Of particular importance is that the region of the rare earth compound containing layer directly under the wafer, in other words corrosion-resistant non-porous layer 320, be dense. Otherwise particles from the heater would tend to be shed onto the underside of the wafer. These shed particles could migrate to the top side of the wafer in a subsequent step, which would in turn result in defects in the patterns on the wafer. The sides, bottom and coverage on the stalk or supporting disk 380 of the wafer heater are less critical, as there is no direct path for particles to migrate to the wafer. A plasma spray coating suffices to prevent against contamination for these other regions.

Figure 4:
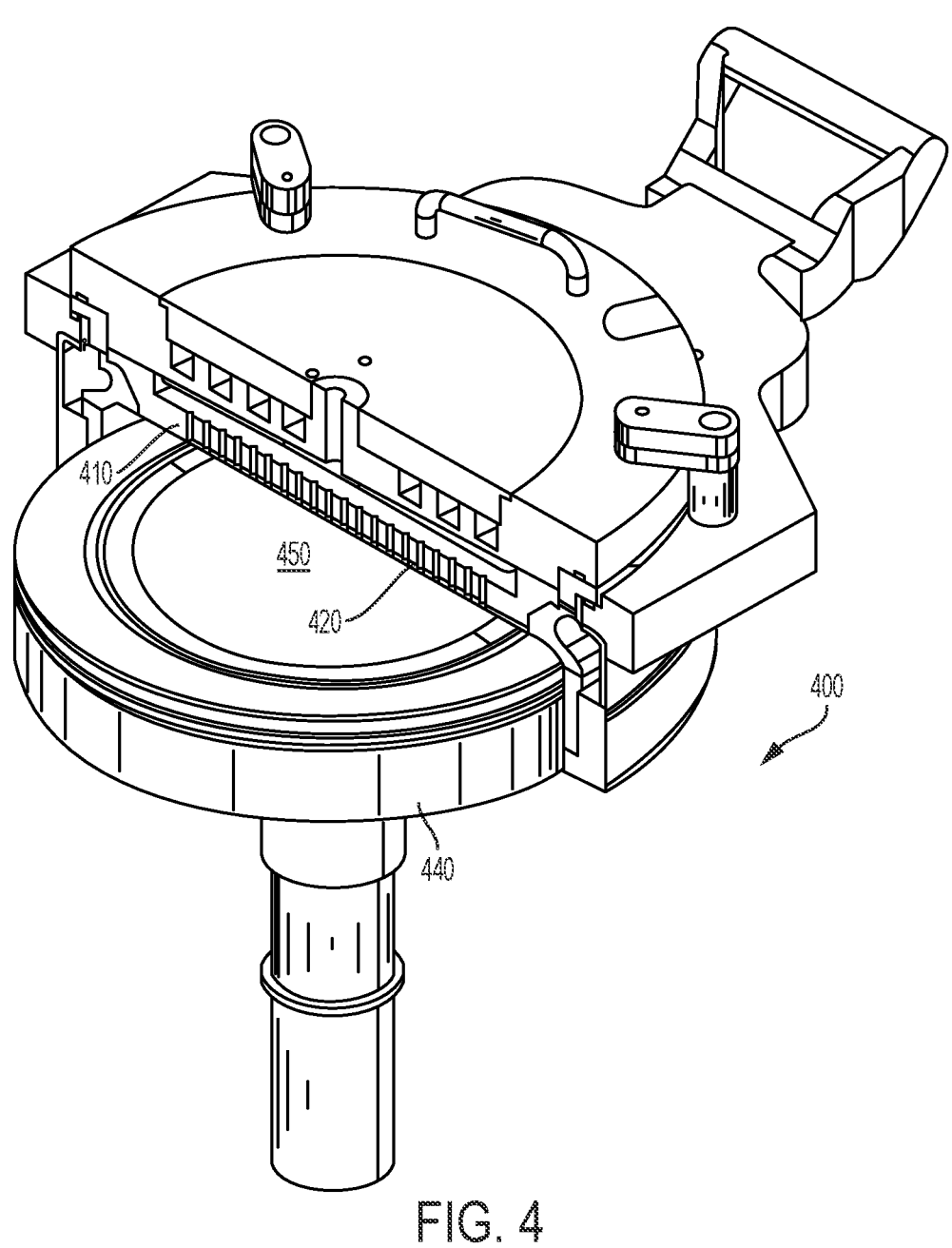

FIG. 4 illustrates a chemical vapor deposition reactor assembly including a wafer heater according to an example aspect of the invention. Chemical vapor deposition (CVD) reactor assembly 400 includes showerhead 410 and heater 440. Reactive gases flow through showerhead 410, which is protected by corrosion-resistant non-porous layer 420, onto wafer 450, where a deposit is formed. The temperature of the wafer is maintained and kept uniform by heater 440, which may also have a non-porous corrosion-resistant layer on it (as shown in FIG. 3) to protect it during cleaning. Showerhead 410 may further include interposing or embedded layers, such as an electrode, within to assist the generation of a plasma to promote chemical reactions.

In an example aspect, assembly 400 is configured for use in fabricating semiconductor chips. Assembly 400 includes corrosion-resistant components (i) wafer heater 440, shown in FIG. 3 as wafer heater 300 in more detail), and/or (ii) showerhead 410. In an example aspect, the deposition reactor is configured for in-situ cleaning with halogen gases and a corrosion-resistant component. Each corrosion-resistant component includes a ceramic insulating substrate; and, a corrosion-resistant non-porous layer of a composition comprising at least 15% by weight of a rare earth compound based on total weight of layer. In an example aspect, the rare earth compound is a trivalent oxide. In another example aspect, the rare earth compound is selected from the group consisting of yttrium oxide ($Y_2O_3$), yttrium silicates, yttrium fluorides, yttrium oxyfluorides, yttrium aluminates, nitrides, complex nitride compounds and combinations of two or more thereof In an example aspect, the rare earth compound is yttrium oxide ($Y_2O_3$). In an example aspect, the ceramic insulating substrate is selected from the group consisting of aluminum oxide, aluminum nitride, silicon nitride, silicate-based materials, and mixtures of two or more thereof. In an example aspect the corrosion-resistant component further includes at least interposing layer between the substrate and the corrosion-resistant non-porous layer. In an example aspect, the interposing layer is selected from the group consisting of ytterbium oxide ($Yb_2O_3$), $MoSi_2$, radio-frequency (RF) conducting materials and mixtures of two or more thereof. In an example aspect, the substrate further includes at least one additional interposing conductive layer embedded therein, the conductive layer having a sheet resistivity of at most 10 Megaohm-cm, which may also be written as 10 megohm-cm interchangeably herein.

In an example aspect, an assembly configured for use in fabricating semiconductor chips, the assembly comprising a reactor and a corrosion-resistant component. The corrosion-resistant component includes a ceramic insulating substrate and a corrosion-resistant non-porous layer associated with the ceramic insulating substrate. In an example aspect, the corrosion-resistant non-porous layer has a composition comprising at least 15% by weight of a rare earth compound based on total weight of the corrosion-resistant non-porous layer. In an example aspect, the corrosion-resistant non-porous layer is characterized by a microstructure substantially devoid of microcracks and fissures, and having: a thickness of at least 50 μm; a porosity of at most 1%; and, an average grain size of at least 100 μm and at most 100 μm.

In an example aspect, the ceramic insulating substrate of the assembly is selected from the group consisting of aluminum oxide, aluminum nitride, silicon nitride, silicate-based materials and mixtures of two or more thereof In an example aspect, the rare earth compound of the assembly is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof. In an example aspect, the corrosion-resistant non-porous layer of the assembly is adhered to the ceramic insulating substrate and has an adhesion strength of at least 20 MPa. In another example aspect, the corrosion-resistant non-porous layer has a thickness of at least 100 μm; a porosity of at most 0.5%;

an adhesion strength of at least 30 MPa; and, an average grain size of at least about 300 μm and at most about 30 μm.

In an example aspect, the assembly further comprises at least one interposing layer embedded in the ceramic insulating substrate, or layered between the ceramic insulating substrate and the corrosion-resistant non-porous layer. In an example aspect, the at least one interposing layer is selected from the group consisting of rare earth oxides, rare earth silicates, rare earth aluminates, and mixtures of two or more thereof. In an example aspect, the at least one interposing layer is ytterbium oxide ($Yb_2O_3$). In an example aspect, the at least one interposing layer comprises conducting materials that have a good coefficient of thermal expansion match with the ceramic insulating substrate and the corrosion-resistant non-porous layer. Thermal expansion mismatches can be considered close if the difference in thermal expansion coefficients is at most $4\times10^{-6}$/K relative to the coefficients for the ceramic insulating substrate and the corrosion-resistant non-porous layer. In an example aspect, the at least one interposing layer is chosen to be a material having a thermal expansion coefficient difference of at most at most $4\times10^{-6}$/K relative to the coefficients for the ceramic insulating substrate and the corrosion-resistant non-porous layer. In an example aspect, the at least one interposing layer further comprises insulating materials. In an example aspect, the at least one interposing layer is selected from the group consisting of ytterbium oxide ($Yb_2O_3$), molybdenum (Mo), tungsten (W), molybdenum disilicide ($MoSi_2$), tungsten carbide (WC), tungsten disilicide ($WSi_2$), and mixtures of two or more thereof.

In an example aspect, the reactor is a plasma etch reactor configured for plasma etching and the corrosion-resistant component is a lid configured for releasable engagement with the plasma etch reactor; and, wherein the lid has a loss tangent of less than $1\times10^{-4}$ and is substantially transparent to radio-frequency (RF) energy. In an example aspect, the reactor is a deposition reactor configured for in-situ cleaning with halogen gases and the corrosion-resistant component is a heater. In an example aspect, the ceramic insulating substrate further includes at least one interposing conductive layer embedded therein, the conductive layer having a sheet resistivity of at most 10 Megaohm-cm. In another example aspect, the reactor is a deposition reactor configured for in-situ cleaning with halogen gases and the corrosion-resistant component is a showerhead.

Another aspect is directed to a method for preparing a corrosion-resistant component for use with a reactor. The method includes the steps as follows: a) laying up a thinner layer of a sinterable powder composition comprising at least 15% by weight based on total weight of the thinner layer of a rare earth compound, and a thicker layer of sinterable substrate material to form a pre-laminate (also referred to herein as 'green laminate'); and, b) heat treating the pre-laminate to form a corrosion-resistant laminate. The terms "thinner" versus "thicker" indicate that the thinner powder layer is less than 50% of the thicker powder layer in the pressing direction. Heat treating is selected from the group consisting of hot pressing and hot isostatic pressing.

In an example aspect of the method, the sinterable substrate material is selected from the group consisting of aluminum oxide, aluminum nitride, silicon nitride, silicate-based materials, and mixtures of two or more thereof. In an example aspect of the method, the rare earth compound is a tri-valent rare earth oxide. In an example aspect of the method, the rare earth compound is selected from the group consisting of yttrium oxide ($Y_2O_3$), yttrium silicates, yttrium fluorides, yttrium oxyfluorides, yttrium aluminates, nitrides, complex nitride compounds and combinations of two or more thereof In an example aspect of the method, the amount of rare earth compound is about 15 to 100 wt %, or about 20 to about 90 wt %, or about 25 to about 80 wt %. In an example aspect, the rare earth compound is $Y_3Si_3O_{10}F$. In an example aspect of the method, the sinterable substrate material is aluminum oxide and the rare earth compound is a trivalent rare earth oxide. In another example aspect of the method, the sinterable substrate material is aluminum nitride and the corrosion-resistant non-porous layer is a rare earth silicate. In an example aspect of the method, the corrosion-resistant component is a lid configured for releasable engagement with a plasma etch reactor. In an example aspect of the method, the lid has a loss tangent of less than $1 \times 10^{-3}$. In another example aspect of the method, the lid has a loss tangent of less than $1 \times 10^{-4}$. In an example aspect of the method, the corrosion-resistant component is substantially transparent to radio-frequency (RF) energy.

In an example aspect the method further comprises laying up at least one additional sinterable powder composition layer interposed between the rare earth compound thinner layer and the substrate material thicker layer, prior to heat treatment. In another example aspect of the method, the at least one additional sinterable powder composition comprises a compound, intermetallic compound, or metal selected from the group consisting of ytterbium oxide ($Yb_2O_3$), molybdenum (Mo), tungsten (W), niobium (Nb), and compounds like molybdenum disilicide ($MoSi_2$), tungsten carbide (WC), tungsten disilicide ($WSi_2$), titanium carbide (TiC), titanium nitride (TiN), and other such conducting materials and compounds that show metallic behavior and have a good coefficient of thermal expansion match to the ceramic insulating substrate and the corrosion-resistant non-porous layer, and mixtures of two or more thereof. In an example aspect of the method, the at least one additional sinterable powder composition is ytterbium oxide ($Yb_2O_3$). In an example aspect, the method includes at least one additional sinterable powder composition comprises conducting materials. In an example aspect, the method includes at least one additional sinterable powder composition comprises conducting metals. In an example aspect, the method includes the at least one additional sinterable powder composition further comprises insulating materials. In another example aspect, the method includes the at least one additional sinterable powder composition further comprises an insulating material selected from the group consisting of alumina, aluminum nitride, silicon nitride, silicates, and mixtures of two or more thereof.

In an example aspect of the method, the semiconductor processing reactor is a deposition reactor configured for in-situ cleaning with halogen gases and the corrosion-resistant component is a heater. In an example aspect of the method, the sinterable substrate material further includes at least one interposing conductive layer embedded therein, the conductive layer having a sheet resistivity of at most 10 Megaohm-cm. In another example aspect of the method, the semiconductor processing reactor is a deposition reactor configured for in-situ cleaning with halogen gases and the corrosion-resistant component is a showerhead.

In an example aspect, a corrosion-resistant component configured for use with a semiconductor processing reactor, similarly as shown in FIG. 1A, is white. In an example aspect, the corrosion-resistant component 100 comprises: a) a ceramic insulating substrate 110; and, b) a white corrosion-resistant non-porous outer layer 120 associated with the ceramic insulating substrate, the white corrosion-resistant non-porous outer layer having a thickness of at least 50 μm, a porosity of at most 1%, and a composition comprising at least 15% by weight of a rare earth compound based on total weight of the corrosion-resistant non-porous layer; and, c) an L* value of at least 90 as measured on a planar surface of the white corrosion-resistant non-porous outer layer. In another example aspect, component 100 comprises an L* value of at least 92 as measured on a planar surface of the white corrosion-resistant non-porous outer layer. In another example aspect, component 100 comprises an L* value of at least 94 as measured on a planar surface of the white corrosion-resistant non-porous outer layer. The ceramic insulating substrate 110 is selected from the group consisting of aluminum oxide, aluminum nitride, silicon nitride, silicate-based materials and mixtures of two or more thereof The rare earth compound is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof. In an example aspect, the rare earth compound is yttrium oxide ($Y_2O_3$). In an example aspect, the white corrosion-resistant non-porous outer layer has a thickness of at least 100 μm, a porosity of at most 0.5%, and an average grain size of at most 50 μm. In an example aspect, the white corrosion-resistant non-porous layer associated with the ceramic insulating substrate is adhered to the substrate. In an example aspect, the corrosion-resistant non-porous layer is adhered directly to the substrate. In another example aspect, the white corrosion-resistant non-porous layer is adhered indirectly to the substrate, for example with interposing layers therebetween.

In at least one embodiment, the white corrosion-resistant non-porous outer layer further comprises a sintering aid added to the rare-earth compound in the range from about 300 ppm to about 20% by weight based upon total weight of the rare-earth compound. In other embodiments, the sintering aid added to the rare-earth compound is in the range from about 0.5% by weight to about 5% by weight based upon total weight of the rare-earth compound. In some embodiments, the sintering aid is at least one material chosen from $ZrO_2$, $HfO_2$, and $CeO_2$. In other embodiments, the sintering aid is at least one material chosen from $ZrO_2$, $HfO_2$, $CeO_2$, and mixtures of two or more thereof. In a preferred embodiment, the sintering aid is $ZrO_2$ and is added to the rare-earth compound in the amount of 1% by weight based upon total weight of the rare-earth compound.

In an example aspect, similarly as shown in FIG. 1B, corrosion-resistant component 150 further comprises at least one interposing layer 130 embedded in the ceramic insulating substrate, or layered between the ceramic insulating substrate 110 and the white corrosion-resistant non-porous outer layer 120, wherein the at least one interposing layer is at least one material chosen from rare earth oxides, rare earth silicates, rare earth aluminates, and mixtures of two or more thereof In an example aspect, the at least one interposing layer 130 is ytterbium oxide ($Yb_2O_3$). In other example aspects, the at least one interposing layer 130 further comprises conducting materials. An assembly configured for use in fabricating semiconductor chips, the assembly comprising: a reactor; and, the corrosion-resistant component having a white corrosion-resistant non-porous outer layer as described above. In an example aspect, the reactor is a plasma etch reactor configured for plasma etching and the corrosion-resistant component is a lid configured for releasable engagement with the plasma etch reactor; and, wherein the lid has a loss tangent of less than $1 \times 10^{-4}$. In an alternate example aspect, the reactor is a deposition reactor configured for in-situ cleaning with halogen gases and the corrosion-resistant component is a heater.

Figure 5:
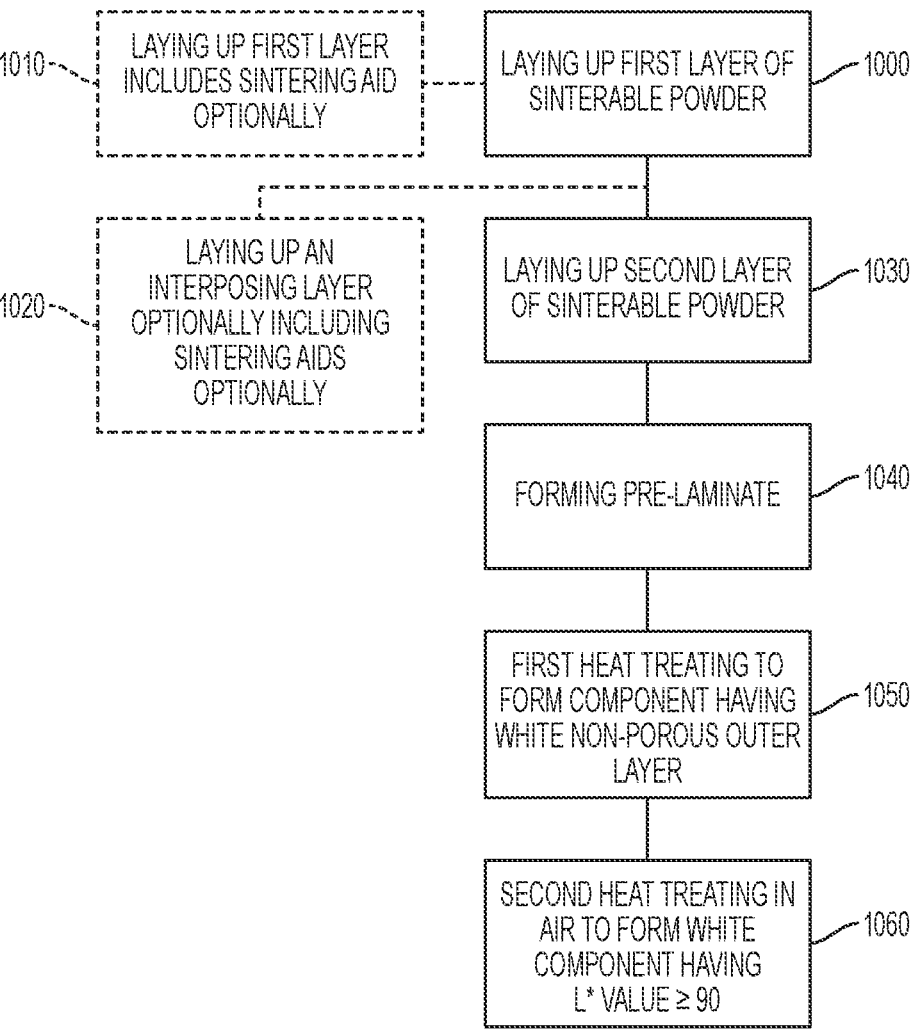
FIG. 5 illustrates a flow chart for a method of making a white corrosion-resistant component according to an example aspect of the invention.

As shown in the flow diagram of FIG. 5, a method for preparing a white corrosion-resistant component for use with a semiconductor processing reactor is provided. The method comprises the following steps. Step 1000 includes laying up a first layer of a sinterable powder composition comprising at least 15% by weight based on total weight of the first layer of a rare earth compound. Step 1030 includes laying up a second layer of sinterable substrate material. Steps 1000 and 1030 together form a pre-laminate in step 1040. The second layer of sinterable substrate material is selected from the group consisting of aluminum oxide, aluminum nitride, silicon nitride, silicate-based materials and mixtures of two or more thereof. The rare earth compound is selected from the group consisting of yttrium oxide ($Y_2O_3$), yttrium silicates, yttrium fluorides, yttrium oxyfluorides, yttrium aluminates, nitrides, complex nitride compounds, and combinations of two or more thereof.

In an example aspect, the first layer of step 1000 is less than 50% as thick as the second layer of step 1030. Step 1050 includes heat treating the pre-laminate to form a corrosion-resistant component including a white corrosion-resistant non-porous outer layer. The white corrosion-resistant non-porous outer layer has a thickness of at least 50 μm and a porosity of at most 1%. The white corrosion-resistant non-porous outer layer is now sintered and associated with the heat treated substrate material, also now sintered, to form a corrosion-resistant laminate having a white non-porous outer layer. The heat treatment of step 1050 includes heat treatment techniques as know n in the art for sintering including non-limiting examples of hot pressing and hot isostatic pressing. Step 1050 typically includes a heat treatment in an inert atmosphere, such as Ar for example, or in a vacuum. The temperature and time of the heat treatment as in step 1050 ranges up to about 1500 C for up to 30 h.

The corrosion-resistant laminate or component formed in step 1050, is then further heat treated in subsequent heat treatment step 1060. Step 1060 includes heat treating the corrosion-resistant laminate in an oxygen-containing gas or air. In an example aspect, the temperature of the second heat treatment ranges from at least 800° C. to at most 1500 C and the time ranges from at least 0.5 h to at most 48 h. In an example aspect, the heat treatment temperature of step 1060 is from at least 1000 C to at most 1400 C, or from at least 1100. C to at most 1300 C, or from at least 1150 C to at most 1250 C. In an example aspect, the heat treatment temperature of step 1060 is about 1200° C. In an example aspect, the heat treatment time duration of step 1060 ranges from at least 1 h to at most 24 h, or from at least 2 h to at most 12 h, or from at least 3 h to at most 6 h. In an example aspect, the heat treatment time duration of step 1060 is about 4 h. This second heat treatment of step 1060 forms a white corrosion-resistant component. The white corrosion-resistant component has an L* value of at least 90 as measured on a planar surface of the white corrosion-resistant non-porous outer layer after step 1060. In a preferred embodiment, the heat treatment of step 1060 is at 1200 C for 4 h. In another example aspect, the white corrosion-resistant component has an L* value of at least 92 as measured on a planar surface of the corrosion-resistant non-porous outer layer. In another example aspect, the white corrosion-resistant component has an L* value of at least 94 as measured on a planar surface of the corrosion-resistant non-porous outer layer.

In other embodiments, step 1000 optionally further includes step 1010 directed to laying up the first layer of sinterable powder composition comprising at least 15% by weight based on total weight of the first layer of a rare earth compound to further comprise a sintering aid added to the rare-earth compound in the range from about 300 ppm to about 20% by weight based upon total weight of the rare-earth compound. In another example aspect, step 1010 includes wherein the sintering aid is at least one material chosen from $ZrO_2$, $HfO_2$, and $CeO_2$. In another example aspect, step 1010 includes the sintering aid added is in the amount of at least 0.5% by weight and at most 5% by weight based upon total weight of the rare-earth compound. In another example aspect, step 1010 includes wherein the sintering aid added is $ZrO_2$ in the amount of about 1% by weight based upon total weight of the rare-earth compound.

In other embodiments, optional step 1020, falling sequentially between step 1000 and step 1030, includes laying up at least one interposing layer of sinterable powder layered between the first layer and the second layer, wherein the at least one interposing layer of sinterable powder is at least one material chosen from rare earth oxides, rare earth silicates, rare earth aluminates, and mixtures of two or more thereof. Step 1030 optionally includes at least one sintering aid added to the interposing layer. In an example aspect, the sintering aid added to the interposing layer is at least one material chosen from $ZrO_2$, $HfO_2$, and $CeO_2$.

Other embodiments include a corrosion-resistant component configured for use with a semiconductor processing reactor. The corrosion-resistant component comprises: a) a ceramic insulating substrate; and, b) a white corrosion-resistant non-porous outer layer associated with the ceramic insulating substrate, the white corrosion-resistant non-porous outer layer having a thickness of at least 50 μm, a porosity of at most 1%, and a composition comprising at least 15% by weight of a rare earth compound based on total weight of the corrosion-resistant non-porous layer and a sintering aid added to the rare-earth compound in the range from about 300 ppm to about 20% by weight based upon total weight of the rare-earth compound, wherein the sintering aid is at least one material chosen from $ZrO_2$, $HfO_2$, and $CeO_2$; c) at least one interposing layer embedded in the ceramic insulating substrate, or layered between the ceramic insulating substrate and the corrosion-resistant non-porous layer, wherein the at least one interposing layer is at least one material chosen from rare earth oxides, rare earth silicates, rare earth aluminates, and mixtures of two or more thereof: and, d) an L* value of at least 90 as measured on a planar surface of the white corrosion-resistant non-porous outer layer. In an example aspect, the planar surface for measurement is smooth and/or polished.

Figure 6A:
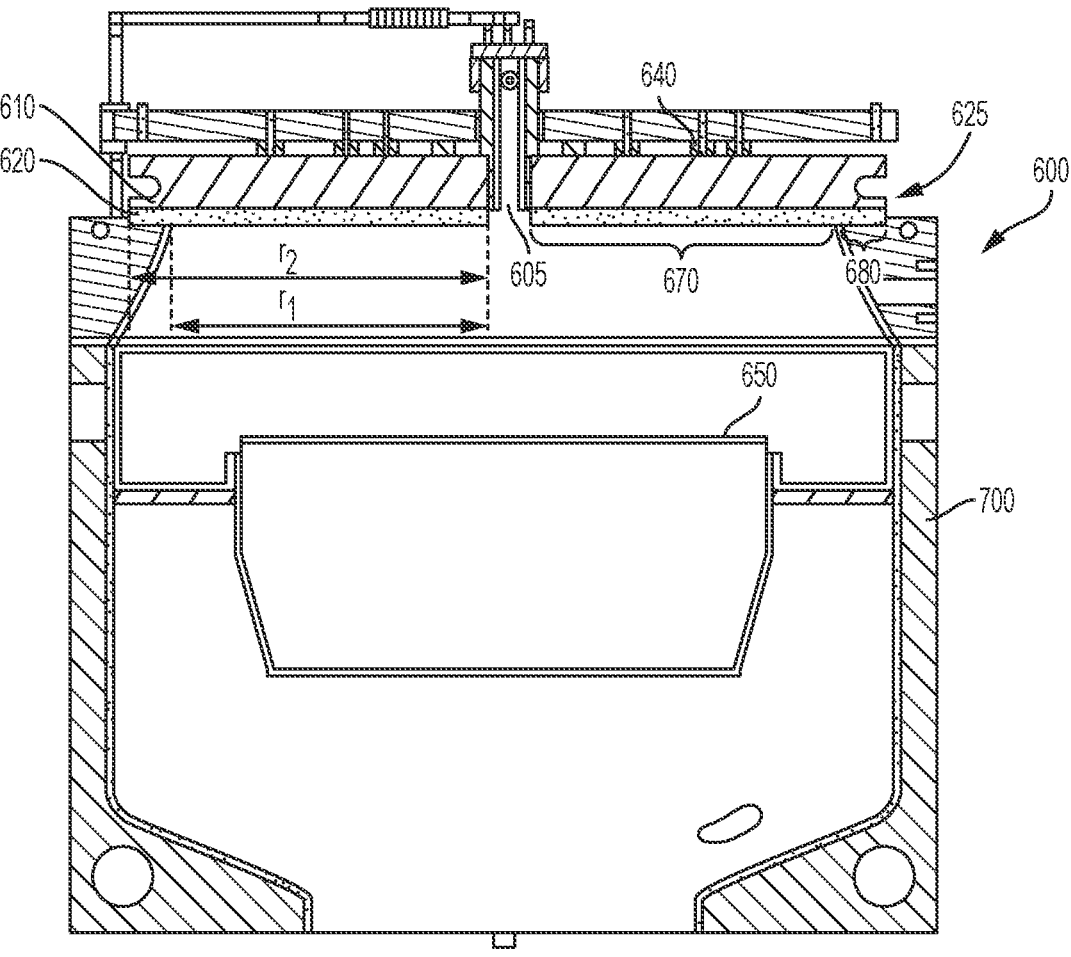
FIG. 6A illustrates an assembly configured for use in plasma etching semiconductor wafers according to an example aspect of the invention.

FIG. 6A illustrates an assembly configured for use in plasma etching semiconductor wafers as in an example aspect. Plasma etch reactor assembly 600 includes plasma etch reactor 700. Alternating magnetic fields generated by induction coils 640 extend through lid 625, creating electric fields inside reactor 700 directly under lid 625, which in turn create the etch plasma. Corrosion-resistant lid 625 is configured for releasable engagement with plasma etch reactor 700. Lid 625 includes a corrosion-resistant ceramic insulating substrate 610 having an inner surface and an outer surface; and, further includes white corrosion-resistant non-porous layer 620, which is adjacent to the inner surface of substrate 610. In an example aspect, substrate 610 is also white. Corrosion-resistant non-porous layer 620, having inner and outer planar surfaces, is positioned so that the inner planar surface of layer 620 faces the interior of reactor 700. Component or lid 625 is disk-shaped and includes an axial void 605 at the center configured to fit into assembly 600. Axial void 605 may also be referred to interchangeably herein as center 605.

Figure 6B:
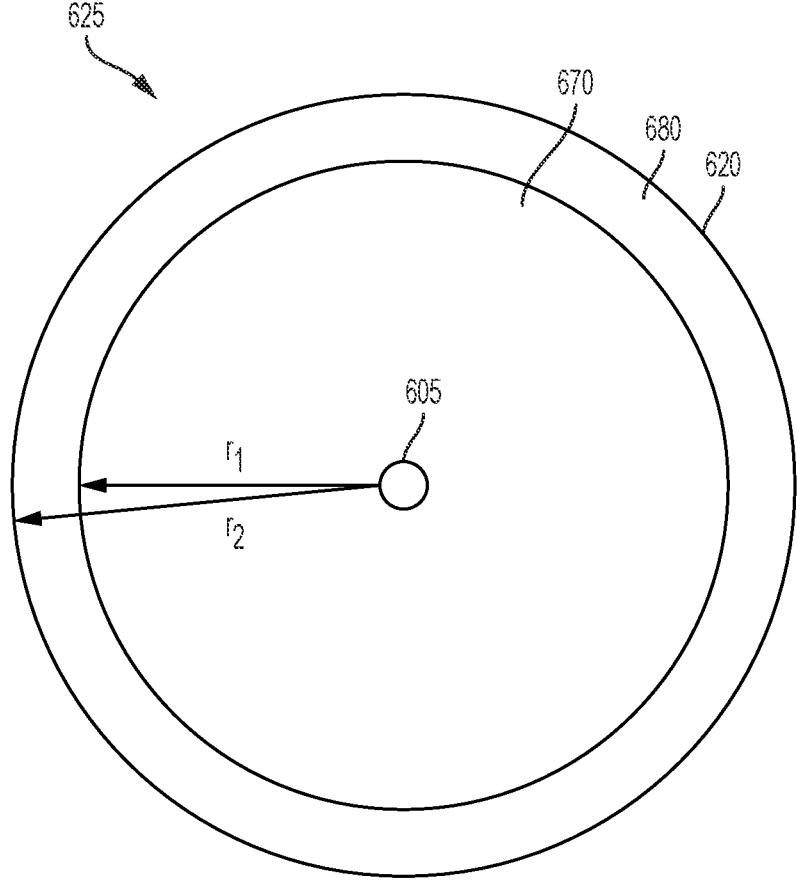
FIG. 6B illustrates a top view of a corrosion-resistant component as shown in FIG. 6A.

FIG. 6B illustrates a top view of lid or component 625 with a view onto the inner planar surface of white corrosion-resistant non-porous layer 620. The inner planar surface of 620, in the non-limiting example shown in top view FIG. 6B for the disk-shaped component, is circular and includes a central region 670 extending to a first radial distance $r_1$ from center 605. The central region 670 of the inner planar surface of layer 620 corresponds to the area of component 625 that is exposed to the interior of reactor 700 and is thus exposed to aggressive processes. Aggressive processes may mean plasma etching, as in this non-limiting example. For other components of the present disclosure, aggressive processes may mean plasma etching or deposition or both. An outer region 680, disposed outside of central region 670, extends from radial distance $r_1$ to a second radial distance 1-7 from center 605. Outer region 680, as shown in FIGS. 6A and 6B, may interchangeably be referred to herein as outer rim 680. Outer region 680 corresponds to the area of component 625 that is not necessarily exposed to aggressive processes and extends radially outward past an o-ring for sealing reactor 700. In an example aspect, L*a*b* measurements are collected for the central region 670 of the inner planar surface of white corrosion-resistant non-porous layer 620 of component 625. The central region 670 may also be referred to herein as planar surface for L*a*b* measurement purposes. In an example aspect, central region 670 is a polished, planar surface.

EXAMPLES

For all examples, and in view of the need to minimize contamination, a total concentration of undesirable elements in raw materials used is at most 1 at %.

Example 1

Two disks (S1 and S12) made from an alumina-yttria laminate were manufactured as follows. High purity chemically precipitated yttrium oxide powder from AMR Corp. was attrition milled in water to particle size d90<1 μm. The slurry was then freeze dried and sieved through a 150 μm mesh.

Spray dried alumina powder of approximate composition 0.25 wt % $SiO_2$, 0.05 wt % $Na_2O$, 0.12 wt % MgO, 0.12 wt % CaO, balance $Al_2O_3$ was heated in air at 800 C for 8 hours to remove binder from the spray dried powder. This powder is referred to as CoorsTek 99512.

The alumina powder was cold pressed in a 6-inch diameter die to a pressure of 440 psi and a total thickness of about 1 inch. A layer of the yttria powder described above was then added on top of the alumina and cold pressed to 440 psi again. The yttria layer was about 2000 μm thick at this point.

For the second laminate (S12), the process was repeated except that a layer of ytterbium oxide ($Yb_2O_3$) powder about 1000 μm was interposed between the yttria layer and the alumina layer.

The cold pressed laminate was transferred to a hot press mold assembly, consisting of the stack arrangement depicted below in Table 1

TABLE 1

| Stack arrangement for Example 1 Hot Pressing. |
| --- |
| TOP |
| 1-inch Graphite Spacer |
| 1 Part |
| 1-inch Graphite Spacer |
| 3-inch Graphite Spacer |
| BOTTOM |

All spacers and parts were 6 inches in diameter. The Die Barrel was 7 inches inside diameter (ID) and 15 inches outside diameter (OD). The assembly was hot pressed according to the temperature schedule shown in Table 2.

TABLE 2

Temperature Cycle during Hot Pressing.

| | Temperature, ° C. | | | |
| --- | --- | --- | --- | --- |
| Time (min) | Ramp (° C./min) | Setpoint, ° C. | Soak (min) | Atmos. |
| 0.0 | | 20 | 1 | Ar |
| 1.0 | 5 | 1050 | | Ar |
| 207.0 | | 1050 | 10 | Ar |
| 217.0 | 5 | 1400 | | Ar |
| 287.0 | | 1400 | 60 | Ar |
| 347.0 | 3 | 1550 | | Ar |
| 397.0 | | 1550 | 60 | Ar |
| 457.0 | 5 | 1050 | | Ar |
| 557.0 | | 1050 | 10 | Ar |
| 567.0 | 5 | 300 | | Ar |
| 717.0 | 5 | 20 | | Ar |
| 773.0 | | 20 | 1 | Ar |

Ar = under argon atmosphere

Pressure was applied according to the cycle shown in Table 3.

TABLE 3

Pressure Cycle during Hot Pressing.

| | | | | Time | |
| --- | --- | --- | --- | --- | --- |
| Pressure | Ramp | Soak | total | segment | |
| Psi | (min) | (min) | min | h | m |
| 6000 | 0 | | 0 | 0 | 0 |
| 6000 | | 287 | 287 | 4 | 47 |
| 7500 | 60 | | 347 | 1 | 0 |
| 7500 | | 102 | 449 | 1 | 42 |
| 6000 | 105 | | 554 | 1 | 45 |
| 6000 | | 208 | 762 | 3 | 28 |

Gray dense yttria-alumina laminates emerged from the hot press operation. The grain size of the alumina as measured by the ASTM-E112 method was 1.7 μm. The carbon content was 640 ppm. The loss tangent of 51 measured at 5 GHz was $9.1 \times 10^{-5}$. Porosity was measured by image analysis of a polished section, polished according to the following scheme (polishing supplies provided by Struers, Inc.):

60 μm diamond: as needed to flatten the surface

15 μm diamond, fixed abrasive pad: 2 min

9 μm diamond, Largo (plastic) pad: 8 min

3 μm diamond, DAC (nylon) pad: 6 min

1 μm diamond, napped cloth: 3 min.

The porosity of 51 and S12 were found to be 0.24% and 0.72% respectively. The corrosion-resistant non-porous yttria layer was observed to substantially have no microcracks or fissures. Measuring from the sections, S1 and S12 had yttria layer thickness of 910 μm and 940 μm respectively. The ytterbium oxide layer thickness measured from the section was 520 μm. Adhesion strength as measured by a variant of ASTM C633 was found to be 30 MPa. As measured herein, adhesion strength is the force required to cause failure when tension is applied between the outermost layer and the substrate, irrespective of the presence or absence of interposing layers or of the location of the failure, provided that the failure is not confined exclusively to the substrate. The outermost layer being adhered to the substrate may include instances wherein at least one interposing layer is included and/or a reaction layer inherently resulting from sintering exists between the outermost layer and the substrate. For sample S1, a reaction layer having composition $Y_3Al_5O_{12}$ between the yttria layer and the alumina substrate was present. Darkness L* of the sample, measured on the yttria side with a Hunterlab MiniScan XE colorimeter using the CIE L*a*b* color scale, was 53.9.

Example 2

Two yttria-aluminate laminates were cold pressed as described for sample S1 in Example 1, except that one laminate (S4) used Grade APA alumina powder from Sasol and the other laminate (S5) used Grade AHPA alumina powder also from Sasol. The cold-pressed disks were hot pressed with the same stackup as shown in Table 4.

TABLE 4

| Stack arrangement for Example 2 Hot Pressing. |
| :---: |
| TOP |
| 1-inch Graphite Spacer |
| 1 Part |
| 1-inch Graphite Spacer |
| 3-inch Graphite Spacer |
| 1 Part |
| 1-inch Graphite Spacer |
| 3-inch Graphite Spacer |
| BOTTOM |

The temperature and pressure cycles are shown in Tables 5 and 6.

TABLE 5

| Temperature Cycle during Example 2 Hot Pressing. | | | | |
| :---: | :---: | :---: | :---: | :---: |
| Temperature, ° C. | | | | |
| Time (min) | Ramp (/min) | Setpoint, ° C. | Soak (min) | Atmos. |
| 0.0 | | 20 | 1 | Ar |
| 1.0 | 5 | 1050 | | Ar |
| 207.0 | | 1050 | 10 | Ar |
| 217.0 | 5 | 1200 | | Ar |
| 247.0 | | 1200 | 60 | Ar |
| 307.0 | 3 | 1400 | | Ar |
| 373.7 | | 1400 | 60 | Ar |
| 433.7 | 5 | 1050 | | Ar |
| 503.7 | | 1050 | 10 | Ar |
| 513.7 | 5 | 300 | | Ar |
| 663.7 | 5 | 20 | | Ar |
| 719.7 | | 20 | 1 | Ar |

Ar = under argon atmosphere

TABLE 6

| Pressure Cycle during Example 2 Hot Pressing. | | | | | |
| :---: | :---: | :---: | :---: | :---: | :---: |
| | | | | Time | |
| Pressure | Ramp | Soak | total | segment | |
| Psi | (min) | (min) | min | h | m |
| 6000 | 0 | | 0 | 0 | 0 |
| 6000 | | 247 | 247 | 4 | 7 |
| 7500 | 60 | | 307 | 1 | 0 |
| 7500 | | 127 | 434 | 2 | 7 |
| 6000 | 80 | | 514 | 1 | 20 |
| 6000 | | 208 | 722 | 3 | 28 |

The grain sizes of the alumina as measured by the ASTM-E112 method were 0.76 μm (S4) and 0.92 μm (S5). The grain size of the yttria measured in the same way was found to be 0.4 μm. The loss tangent of S4 at 5 GHz was found to be $11 \times 10^{-5}$, and that of S5 to be $15.7 \times 10^{-5}$.

The porosity of both samples was measured by the method described in Example 1 S4 had a porosity of 0.50% and S5 of 0.69%. Substantially no microcracks or fissures were observed in the corrosion-resistant non-porous yttria layer. Adhesion strength as measured by ASTM C633 was found to be 20 MPa for S4 and 26 MPa for S5. As with sample S1, a reaction layer between the yttria layer and alumina substrate was present. Darkness L* of the sample, measured on the yttria side with a Hunterlab Mini Scan XE colorimeter using the CIE L*a*b* color scale, was 49.7 for S4 and 66.1 for S5.

Example 3

Two yttria-alumina laminates were cold pressed as described in Example 2. One laminate (S6) used AHPA alumina powder from Sasol, and the other laminate (S7) used Baikowski TCPLS DBM alumina powder from Baikowski-Malakoff. Each laminate was placed between sheets of Mo foil.

The cold-pressed disks were hot pressed with the same stack configuration as in Example 2. The temperature and pressure cycles are shown in Tables 7 and 8.

TABLE 7

| Temperature Cycle during Example 3 Hot Pressing. | | | | |
| :---: | :---: | :---: | :---: | :---: |
| Temperature, ° C. | | | | |
| Time (min) | Ramp (/min) | Setpoint, ° C. | Soak (min) | Atmos. |
| 0.0 | | 20 | 1 | Ar |
| 1.0 | 5 | 1050 | | Ar |
| 207.0 | | 1050 | 10 | Ar |
| 217.0 | 3 | 1200 | | Ar |
| 267.0 | | 1200 | 1 | Ar |
| 268.0 | 3 | 1400 | | Ar |
| 334.7 | | 1400 | 60 | Ar |
| 394.7 | 5 | 1050 | | Ar |
| 464.7 | | 1050 | 10 | Ar |
| 474.7 | 5 | 300 | | Ar |
| 624.7 | 5 | 20 | | Ar |
| 680.7 | | 20 | 1 | Ar |

Ar = under argon atmosphere

TABLE 8

Pressure cycle during Example 3 Hot Pressing.

| Pressure | Ramp | Soak | Time total | | |
|---|---|---|---|---|---|
| | | | | segment | |
| Psi | (min) | (min) | min | h | m |
| 6000 | 0 | | 0 | 0 | 0 |
| 6000 | | 217 | 217 | 3 | 37 |
| 7500 | 30 | | 247 | 0 | 30 |
| 7500 | | 148 | 395 | 2 | 28 |
| 6000 | 80 | | 475 | 1 | 20 |
| 6000 | | 208 | 683 | 3 | 28 |

The loss tangent of sample S6 was measured to be 4×10'5 L* was found to be 75.4 for S6 and 75.9 for S7. Adhesion strength for S6 was 24 MPa and 35 MPa for S7.

Example 4

Two yttria-alumina laminates were cold pressed as described for Sample S7 in Example 3. One laminate (S8) used AHPA alumina powder from Sasol with which about 0.5% AlF3 had been dry mixed, and the other laminate (S9) used Baikowski SA-80 alumina powder from Baikowski-Malakoff (without $AlF_3$ additions). Each laminate was placed between sheets of molybdenum (Mo) foil.

Fluoride was added to S8 as a densification aid. The cold-pressed disks were hot pressed with the same stackup as in Example 2. The temperature cycle is shown in Table 9. The pressure cycle is same as for Table 6, previously shown.

TABLE 9

Temperature cycle for Example 4 Hot Pressing.

| Temperature, ° C. | | | | |
|---|---|---|---|---|
| Time (min) | Ramp (/min) | Setpoint, ° C. | Soak (min) | Atmos. |
| 0.0 | | 20 | 1 | Ar |
| 1.0 | 5 | 1050 | | Ar |
| 207.0 | | 1050 | 10 | Ar |
| 217.0 | 5 | 1200 | | Ar |
| 247.0 | | 1200 | 60 | Ar |
| 307.0 | 3 | 1400 | | Ar |
| 373.7 | | 1400 | 60 | Ar |
| 433.7 | 5 | 1050 | | Ar |
| 503.7 | | 1050 | 10 | Ar |
| 513.7 | 5 | 300 | | Ar |
| 663.7 | 5 | 20 | | Ar |
| 719.7 | | 20 | 1 | Ar |

Ar = under argon atmosphere

The laminate made from the AHPA powder including AlF3 additions was cracked in several places on removal and a porous interface between the yttria layer and the alumina layer was observed. The loss tangent of this sample (S8) was $2×10^{-5}$. The loss tangent of S9 was $4.6×10^{-5}$. L* was found to be 48.6 for S8 and 76.0 for S9. Adhesion strength for S8 was less than 5 MPa and was 39 MPa for S9.

Example 5

Two yttria-alumina laminates were cold pressed as described for sample S9 in Example 4, except that a layer of ytterbium oxide ($Yb_2O_3$) powder about 0.04" was interposed between the yttria and the alumina layer. Both laminates used the CoorsTek 99512 powder described in Example 1. One laminate (S11) had one layer of 0.004" Mo foil placed on one side, while the other one (S10) did not.

The cold-pressed disks were hot pressed with the same stackup as in Example 2.

The pressure and temperature cycles are the same as for example 4.

The loss tangent of S10 was found to be $15×10^{-5}$, and its porosity was measured to be 1%. Substantially no microcracks or fissures were observed in the corrosion-resistant non-porous yttria layer. The as-hot-pressed layer thickness of $Y_2O_3$ was 920 μm and the thickness of the $Yb_2O_3$ layer was 530 μm after hot pressing. L* was found to be 49.7 for S10. Adhesion strength for S10 was 28 MPa.

For S11, the as-hot-pressed layer thickness of $Y_2O_3$ was 700 μm and the thickness of the $Yb_2O_3$ layer was 450 μm after hot pressing.

Example 6

One yttria-alumina laminate (S43) was cold pressed as described in Example 5, except that the yttria and ytterbia powders were supplied by PIDC. The laminate used the APA powder from Sasol. Mo foil was placed on both sides of the laminate.

The cold-pressed disk was hot pressed with the same stackup as in Table 4 for Example 2. The temperature and pressure cycles are shown in Tables 10 and 11

TABLE 10

Temperature Cycle for Example 6 Hot Pressing.

| Temperature, ° C. | | | | |
|---|---|---|---|---|
| Time (min) | Ramp (/min) | Setpoint, ° C. | Soak (min) | Atmos. |
| 0.0 | | 20 | 1 | Vac |
| 1.0 | 5 | 1050 | | Vac |
| 207.0 | | 1050 | 10 | Vac |
| 217.0 | 3 | 1200 | | Vac |
| 267.0 | | 1200 | 1 | Vac |
| 268.0 | 3 | 1550 | | Vac |
| 384.7 | | 1550 | 60 | Vac |
| 444.7 | 5 | 1050 | | Vac |
| 544.7 | | 1050 | 10 | Vac |
| 554.7 | 5 | 300 | | Vac |
| 704.7 | 5 | 20 | | Vac |
| 760.7 | | 20 | 1 | Vac |

TABLE 11

Pressure Cycle for Example 6 Hot Pressing.

| Pressure | Ramp | Soak | Time total | | |
|---|---|---|---|---|---|
| | | | | segment | |
| Psi | (min) | (min) | min | h | m |
| 0 | 0 | | | 0 | 0 |
| 0 | | 217 | 217 | 3 | 37 |
| 2000 | 30 | | 247 | 0 | 30 |
| 2000 | | 198 | 445 | 3 | 18 |
| 0 | 110 | | 555 | 1 | 50 |
| 0 | | 151 | 706 | 2 | |

The as-hot-pressed layer thickness of $Y_2O_3$ for S43 was 2950 μm and the thickness of the $Yb_2O_3$ layer was 525 μm after hot pressing.

Example 7

One yttria-alumina laminate (S50) was cold pressed as described in Example 6. The laminate used the APA powder from Sasol. Mo foil was placed on both sides of the laminate. The yttria powder was mixed with 1 wt % $ZrO_2$ before use.

The cold-pressed disk was hot pressed with the same stackup as in Table 4 for Example 2. The pressure and temperature cycles are the same as for Example 6. The loss tangent of S50 was found to be $2.39 \times 10^{-5}$. The as-hot-pressed layer thickness of $Y_2O_3$ was 720 μm and the thickness of the $Yb_2O_3$ layer was 350 μm after hot pressing. The grain size of the yttrium oxide layer was estimated to be about 2 μm.

Example 8

Two yttria-alumina laminates were cold pressed as described in Example 7. One laminate (S54) used the APA powder by Sasol, along with PIDC yttria and a 40 μm thick ceramic tape of ytterbia, with the ytterbia powder also coming from PIDC. The second laminate (S55) used HPA alumina from Orbite Technologies, along with PIDC yttria and ytterbia. Both laminates had Mo foil on both faces.

The cold-pressed disks were hot pressed with the same stackup as in Table 4 for Example 2. The pressure and temperature cycles are the same as for Example 6. The loss tangent of S54 was found to be $3.93 \times 10^{-5}$. The as-hot-pressed layer thickness of $Y_2O_3$ was 985 μm and the thickness of the $Yb_2O_3$ layer was 40 μm after hot pressing. For S55, the loss tangent was found to be 2.06×10-5. The as-hot-pressed layer thickness of $Y_2O_3$ was 1000 μm and the thickness of the $Yb_2O_3$ layer was 315 μm after hot pressing. The grain size of the yttrium oxide layers for S54 and S55 were determined to be about 5 to 20 μm.

Example 9

Two yttria-alumina laminates were cold pressed as described in Example 8. One laminate (S57) used the APA powder by Sasol, along with PIDC yttria mixed with 3 vol % yttrium oxyfluoride (YOF) and PIDC ytterbia. The second laminate (S58) APA powder by Sasol, PIDC ytterbia, and PIDC yttria mixed with 3 vol % $Y_2Si_2O_7$. Both laminates had Mo foil on both faces.

The cold-pressed disks were hot pressed with the same stackup as in Table 4 for Example 2. The pressure and temperature cycles are the same as for Example 6. The loss tangent of S57 was found to be $4.50 \times 10^{-5}$. The as-hot-pressed layer thickness of $Y_2O_3$ was 1085 μm and the thickness of the $Yb_2O_3$ layer was 380 μm after hot pressing. The grain size of the yttrium oxide layer for S57 was determined to be about 50 μm. For S58, the loss tangent was found to be $7.73 \times 10^{-5}$. The as-hot-pressed layer thickness of $Y_2O_3$ was 980 μm and the thickness of the $Yb_2O_3$ layer was 425 μm after hot pressing. The grain size of the yttrium oxide layer for S58 was determined to be about 5 to 10 μm.

Example 10

One laminate (S49) was cold pressed as described in Example 6. The laminate used the APA powder from Sasol as the alumina base and a blend of 77 wt % yttria, 15 wt % zirconia, and 8 wt % alumina as the top layer. Mo foil was placed on both sides of the laminate.

The cold-pressed disk was hot pressed with the same stackup as in Table 4 for Example 2. The pressure and temperature cycles are the same as for Example 6. The loss tangent of S49 was found to be $13.3 \times 10^{-5}$. The as-hot-pressed layer thickness of blended layer was 1215 tm. Adhesion of the laminate was found to be 32 MPa. The average grain size of the yttria-rich grains of the non-porous layer was estimated to be about 2 pm. At least one second phase, namely alumina-rich grains of the composition $Y_4Al_2O_9$, was observed in the microstructure and this second phase is believed to contribute to increased strength of the layer.

A summary of properties for Examples 1 through 10 is included in Table 12.

Large 580 μm laminate disks were prepared as follows.

Example 11

Sample A was prepared by loading 29.5 kg of alumina powder (APA) into a 580 μm diameter graphite die, followed by leveling and compacting with 100 kN of force. Then, 2.5 kg of $Yb_2O_3$ powder (PIDC) was loaded on top of the alumina layer, leveled and compacted with 100 kN of force. Next, 4 kg of $Y_2O_3$ powder (PIDC) was loaded on top of the ytterbia layer, leveled and compacted with 100 kN of force. The graphite dies of the hot press were separated from the charge by a layer of 0.02" Grafoil and then a layer of 0.005" molybdenum foil. The temperature and pressure cycles for hot pressing are shown in Table 13. Temperature ramps between the values indicated were approximately linear. Pressure increases were immediate.

TABLE 13

Temperature & Pressure Cycle during Example 11 Hot Pressing.

| Time (min) | Setpoint, ° C. | Pressure (psi) | Atmos. |
|---|---|---|---|
| 0.0 | 25 | 660 | Ar |
| 370 | 1020 | 1320 | Ar |
| 440 | 1100 | 1652 | Ar |
| 560 | 1100 | 1652 | Ar |
| 620 | 1200 | 1982 | Ar |
| 660 | 1200 | 1982 | Ar |
| 720 | 1300 | 1982 | Ar |
| 780 | 1300 | 2312 | Ar |
| 840 | 1300 | 2646 | Ar |
| 920 | 1400 | 2646 | Ar |
| 980 | 1400 | 2646 | Ar |
| 1050 | 1500 | 2646 | Ar |
| 1330 | 1500 | 2646 | Ar |
| 1370 | 1450 | 0 | Ar |

After hot pressing, the disk was ground and polished on the yttria side prior to color measurements in various locations on the component, also referred to as disk or window. Color measurements were obtained using a Hunterlab Miniscan XE instrument using the CieLab L*,a*,b* scale. Measurement locations were selected visually by the operator to represent variations in uniformity. For Sample A, large fragments of the window were selected for measurement in one area where the color was judged by eye to be the darkest and two areas where the color was judged by eye to be the lightest. Sample A showed unacceptable color uniformity. Results are included in Table 15.

Example 12

For Sample B, a 580 mm disk was prepared in the same manner as for Sample A, except that the temperature and pressure cycles for hot pressing are shown in Table 14. Processing of Sample B also included a separate heat treating step as described below.

TABLE 14

Temperature & Pressure Cycle during Example 12 Hot Pressing.

| Time (min) | Setpoint, ° C. | Pressure (psi) | Atmos. |
|---|---|---|---|
| 0.0 | 25 | 660 | Ar |
| 370 | 1005 | 1320 | Ar |
| 440 | 1100 | 1652 | Ar |
| 560 | 1100 | 1652 | Ar |
| 630 | 1200 | 1982 | Ar |
| 760 | 1200 | 1982 | Ar |
| 900 | 1300 | 1982 | Ar |
| 960 | 1300 | 2312 | Ar |
| 1020 | 1300 | 2646 | Ar |
| 1160 | 1400 | 2646 | Ar |
| 1280 | 1400 | 2646 | Ar |
| 1420 | 1500 | 2646 | Ar |
| 1780 | 1500 | 2646 | Ar |
| 1830 | 1470 | 0 | Ar |

After hot pressing, the Sample B disk was additionally heat treated in air at 1200° C. for 4 hours, then ground and polished on the yttria side. By visual observation, the whiteness of Sample B was observed to be enhanced over Sample A. Color was measured using a Hunterlab Miniscan XE instrument as with Sample A. For Sample B, large fragments of the window were selected for measurement in two areas where the color was judged by eye to be the darkest and two areas where the color was judged by eye to be the lightest. Measurement results, included in Table 15, show Sample B to be fairly white with an L* consistently greater than 88. Shading and hue variations are evidenced by the difference in L* between locations of more than 5 and the difference of a* or b* of more than 3, respectively.

Example 13

For Sample C, a 580 mm disk was prepared in the same manner as for Sample B except that the yttria layer and the interposing ytterbia layer of Sample C both further include zirconia as sintering aid. Before the yttria powder was added to the mold, 1 mole percent of TZ3Y powder (5.2 wt % $Y_2O_3$ in $ZrO_2$, supplied by Tosoh Corp.) was mixed into the $Y_2O_3$ powder using a Resodyn mixer. For the ytterbia powder, 1 mole percent of TZ3Y powder was attrition milled together with the ytterbia, followed by spray drying of the resulting slurry. The resulting powder was then used. After hot pressing, the disk was then heat treated in air at 1200° C. for 4 hours. Sample C was then ground and polished on the yttria side. Color was measured using a Hunterlab Miniscan XE instrument as with Samples A and B. For Sample C, large fragments of the window were selected for measurement in one area where the color was judged by eye to be the darkest and two areas where the color was judged by eye to be the lightest. Measurement results, included in Table 15, show Sample C to be white with an L* consistently greater than 92. Shading and hue variations are less than for Samples A and B as evidenced by the difference in L* between locations of less than 5 and the difference of a* or b* of less than 3, respectively. Average grain size of the yttria layer for Sample C was measured to be 5.4 μm as determined by ASTM E112-96. Average grain size of the ytterbia layer for Sample C was measured to be 0.5 μm as determined by ASTM E112-96. The porosity was measured to be less than 1% for the ytterbia layer of Sample C. Carbon content for Sample C was measured by combustion to be less than 30 parts per million by weight.

TABLE 15

L*a*b* Results for Examples 11-13.

| Sample | Location | L* | a* | b* |
|---|---|---|---|---|
| A | 1 | 82.04 | −0.03 | 1.29 |
| A | 2 | 77.57 | −0.03 | 1.28 |
| A | 3 | 67.72 | −0.01 | 1.29 |
| B | 1 | 96.44 | 0.01 | 1.46 |
| B | 2 | 92.49 | 0.15 | 4.20 |
| B | 3 | 90.57 | 0.17 | 3.05 |
| B | 4 | 93.85 | −0.63 | −0.27 |
| C | 1 | 92.04 | −0.61 | 0.44 |
| C | 2 | 94.62 | 0.50 | 1.21 |
| C | 3 | 96.53 | 0.54 | 2.40 |

Listing of Elements

| | |
|---|---|
| 100 | corrosion-resistant component |
| 110 | ceramic insulating substrate |
| 120 | corrosion-resistant non-porous layer |
| 130 | interposing layer |
| 150 | corrosion-resistant non-porous layer |
| t1 | thickness of layer 120 |
| t2 | thickness of layer 130 |
| 200 | plasma etch reactor assembly |
| 210 | ceramic insulating substrate |
| 220 | corrosion-resistant non-porous layer |
| 225 | lid |
| 240 | induction coil |
| 250 | reactor |
| 300 | heater apparatus |
| 320 | corrosion-resistant non-porous layer |
| 330 | interposing layer |
| 330 | insulating ceramic |
| 340 | heating element(s) |
| 360 | radio-frequency (RF) shield |
| 380 | supporting disk |
| 400 | CVD reactor assembly |
| 410 | showerhead |
| 420 | corrosion-resistant non-porous layer |
| 440 | heater |
| 450 | wafer being processed |
| 600 | plasma etch reactor assembly |
| 605 | center or axial void |
| 610 | ceramic insulating substrate |
| 620 | corrosion-resistant non-porous layer |
| 625 | lid |
| 640 | induction coil |
| 650 | wafer |
| 670 | central region of the inner planar surface of 620 |
| 680 | outer region |
| 700 | reactor |

TABLE 12

| | | | | | | | | | |
|---|---|---|---|---|---|---|---|---|---|
| Sample ID | Y$_2$O$_3$ Thickness (μm) | Yb$_2$O$_3$ Thickness (μm) | Porosity (%) | Loss Tangent (×10$^{-5}$) | L* | Adhesion (MPa) | Grain Size Alumina (μm) | Grain Size Yttria (μm) | Carbon (ppm) |
| 1 | 908 | — | 0.24 | 9.1 | 53.9 | 30 | 1.7 | — | 640 |
| 4 | 799 | — | 0.5 | 11 | 49.7 | 20 | 0.76 | 0.4 | — |
| 5 | 626 | — | 0.69 | 15.7 | 66.1 | 26 | 0.92 | — | — |
| 6 | — | — | — | 4 | 75.4 | 24 | — | — | — |
| 7 | — | — | — | 53.2 | 75.9 | 35 | — | — | — |
| 8 | — | — | — | 2.3 | 76.0 | <5 | — | — | — |
| 9 | — | — | — | 4.6 | 48.6 | 38 | — | — | — |
| 10 | 920 | 530 | 1 | 15 | 49.7 | 28 | — | — | — |
| 11 | 704 | 447 | 0.66 | — | — | — | — | — | — |
| 12 | 935 | 524 | 0.72 | — | — | — | — | — | — |
| 43 | 2950 | 525 | — | — | — | — | — | — | — |
| 49 | 1215 (top layer) | — | <1 | 13.3 | — | 32 | — | 2 | — |
| 50 | 720 | 350 | — | 2.4 | — | — | — | 2 | — |
| 54 | 985 | 40 | — | 3.9 | — | — | — | 5-20 | — |
| 55 | 1000 | 315 | — | 2.1 | — | — | — | 5-20 | — |
| 57 | 1085 | 380 | — | 4.5 | — | — | — | 50 | — |
| 58 | 980 | 425 | — | 7.7 | — | — | — | 5-10 | — |

Summary of Properties.

Other Embodiments

A number of variations and modifications of the disclosure can be used. It would be possible to provide for some features of the disclosure without providing others.

The present disclosure, in various aspects, embodiments, and configurations, includes components, methods, processes, systems and/or apparatus substantially as depicted and described herein, including various aspects, embodiments, configurations, subcombinations, and subsets thereof. Those of skill in the art will understand how to make and use the various aspects, aspects, embodiments, and configurations, after understanding the present disclosure. The present disclosure, in various aspects, embodiments, and configurations, includes providing devices and processes in the absence of items not depicted and/or described herein or in various aspects, embodiments, and configurations hereof, including in the absence of such items as may have been used in previous devices or processes, for example, for improving performance, achieving ease and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more, aspects, embodiments, and configurations for the purpose of streamlining the disclosure. The features of the aspects, embodiments, and configurations of the disclosure may be combined in alternate aspects, embodiments, and configurations other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed aspects, embodiments, and configurations. Thus, the following claims are hereby incorporated into this Detailed Description, with each claim standing on its own as a separate preferred embodiment of the disclosure.

Moreover, though the description of the disclosure has included description of one or more aspects, embodiments, or configurations and certain variations and modifications, other variations, combinations, and modifications are within the scope of the disclosure, for example, as may be within the skill and knowledge of those in the art, after understanding the present disclosure. It is intended to obtain rights which include alternative aspects, embodiments, and configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

From the above description, one skilled in the art can easily ascertain the essential characteristics of the present invention, and without departing from the spirit and scope thereof, can make various changes and modifications of the invention to adapt it to various usages and conditions. Thus, other embodiments are also considered to be within the scope of the present claims.

What is claimed is:

1. A component comprising:

(a) a ceramic insulating substrate;

wherein the ceramic insulating substrate is selected from the group consisting of aluminum oxides, aluminum nitrides, silicon nitrides, and mixtures thereof; and (b) an outer layer adhered to the ceramic insulating substrate, the outer layer comprising:

a porosity of at most 1%;

an average grain size of at least 100 nm and at most 100 μm;

a composition comprising at least 15% by weight of a rare earth compound based on total weight of the outer layer;

wherein the rare earth compound is selected from the group consisting of yttrium oxide, yttrium silicates, yttrium fluorides, yttrium oxyfluorides, yttrium aluminates, yttrium nitrides, and mixtures thereof;

a thickness from about 50 μm to about 500 μm; and a microstructure having less than 50 microcracks and fissures per mm$^2$;

wherein the component realizes a loss tangent of less than 1×10$^{-4}$.

2. The component of claim 1, wherein the outer layer is adhered to the ceramic insulating substrate, and wherein an adhesion strength between the outer layer and the ceramic insulating substrate is at least 20 MPa.

3. The component of claim 1, further comprising a carbon content of at most 1000 ppm.

4. The component of claim 1, wherein the porosity is at most 0.5%, the thickness is at least 100 μm, and the average grain size is at least about 300 nm and at most about 30 μm.

5. The component of claim 1, wherein the outer layer further comprises a sintering aid selected from the group consisting of $ZrO_2$, $HfO_2$, and $CeO_2$ added to the rare-earth compound in the range from about 300 ppm to about 20% by weight based upon a total weight of the rare-earth compound.

6. The component of claim 1, further comprising at least one interposing layer embedded in the ceramic insulating substrate or layered between the ceramic insulating substrate and the outer layer, wherein a material of the at least one interposing layer is selected from the group consisting of rare earth oxides, rare earth silicates, rare earth aluminates, and mixtures thereof.

7. The component of claim 6, wherein the at least one interposing layer is adhered to both the outer layer and to the ceramic insulating substrate, and the outer layer has an adhesion strength of at least 20 MPa.

8. The component of claim 6, wherein the material of the at least one interposing layer consists essentially of ytterbium oxide ($Yb_2O_3$).

9. The component of claim 1, wherein the component realizes a loss tangent of not greater than $9.1 \times 10^{-5}$.

10. The component of claim 1, wherein the component realizes a loss tangent of not greater than $7.7 \times 10^{-5}$.

11. The component of claim 1, wherein the component realizes a loss tangent of not greater than $4.5 \times 10^{-5}$.

12. The component of claim 1, wherein the component realizes a loss tangent of not greater than $3.9 \times 10^{-5}$.

13. The component of claim 1, wherein the component realizes a loss tangent of not greater than $2.4 \times 10^{-5}$.

14. The component of claim 1, wherein the component realizes a loss tangent of not greater than $2.1 \times 10^{-5}$.

15. A component comprising:
(a) an aluminum oxide substrate; and
(b) an outer yttrium oxide layer proximal the aluminum oxide substrate, the outer layer comprising:
(i) a porosity of at most 1%;
(ii) an average grain size of at least 100 nm and at most 100 μm;
(iii) a composition comprising at least 15% by weight of the yttrium oxide based on total weight of the outer layer;
(iv) a thickness from about 50 μm to about 500 μm; and
(v) a microstructure having less than 50 microcracks and fissures per $mm^2$;
wherein the component realizes a loss tangent of less than $1 \times 10^{-4}$.

16. The component of claim 15, wherein the aluminum oxide substrate consists essentially of aluminum oxide.

17. The component of claim 16, wherein the outer yttrium oxide layer consists essentially of yttrium oxide.

18. The component of claim 17, wherein the component comprises an interposing layer, and wherein the interposing layer is disposed between the outer yttrium oxide layer and the aluminum oxide substrate.

19. The component of claim 18, wherein the interposing layer comprises ytterbium oxide.

20. The component of claim 17, wherein the component is configured for use in fabricating semiconductor chips and for in-situ cleaning with halogen gases.

21. The component of claim 20, wherein the component is configured for use as a lid of a semiconductor processing reactor.

22. The component of claim 21, wherein the lid is configured to permit magnetic fields created outside the reactor to pass through the reactor and occur in the reactor.

\* \* \* \* \*